US012112827B2

(12) United States Patent
Kim et al.

(10) Patent No.: US 12,112,827 B2
(45) Date of Patent: Oct. 8, 2024

(54) MEMORY DEVICE AND METHOD FOR CALIBRATING THE DEVICE AND FABRICATING THE DEVICE

(71) Applicant: Samsung Electronics Co., Ltd., Suwon-si (KR)

(72) Inventors: Joo Hwan Kim, Seoul (KR); Jun Young Park, Seongnam-si (KR); Jin Do Byun, Suwon-si (KR); Kwang Seob Shin, Anyang-si (KR); Eun Seok Shin, Seoul (KR); Hyun-Yoon Cho, Uiwang-si (KR); Young Don Choi, Seoul (KR); Jung Hwan Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 167 days.

(21) Appl. No.: 17/852,664

(22) Filed: Jun. 29, 2022

(65) Prior Publication Data

US 2023/0143365 A1     May 11, 2023

(30) Foreign Application Priority Data

Nov. 5, 2021   (KR) .......................... 10-2021-0151198

(51) Int. Cl.
*G11C 7/10*          (2006.01)
*H03K 19/00*      (2006.01)

(52) U.S. Cl.
CPC .... *G11C 7/1048* (2013.01); *G11C 2207/2254* (2013.01); *H03K 19/0005* (2013.01)

(58) Field of Classification Search
CPC .......... G11C 7/1048; G11C 2207/2254; H03K 19/0005
See application file for complete search history.

(56) References Cited

U.S. PATENT DOCUMENTS 7,710,143 B2 *  5/2010  Jeong ................... G11C 7/1048
                                              326/16
7,755,383 B2 *  7/2010  Jeong ................... G11C 7/1057
                                              326/26

(Continued)

FOREIGN PATENT DOCUMENTS

JP              6890701 B1      6/2021

*Primary Examiner* — Son L Mai
(74) *Attorney, Agent, or Firm* — Harness, Dickey & Pierce, P.L.C.

(57) ABSTRACT

A method includes measuring a linearity of a first pull-up circuit, a second pull-up circuit, a third pull-up circuit, a first pull-down circuit, a second pull-down circuit and a third pull-down circuit using an initial pull-up code and an initial pull-down code, each of the first pull-up circuit, the second pull-up circuit and the third pull-up circuit having a respective resistance value determined based on a respective pull-up code, and each of the first pull-down circuit, the second pull-down circuit and the third pull-down circuit having a respective resistance value determined based on a respective pull-down code, and determining a calibration setting indicator based on the measurement result, the calibration setting indicator indicating a calibration method of a transmission driver including the first pull-up circuit, the second pull-up circuit, the third pull-up circuit, the first pull-down circuit, the second pull-down circuit and the third pull-down circuit.

20 Claims, 20 Drawing Sheets

(56) References Cited

U.S. PATENT DOCUMENTS

| | | | |
|---|---|---|---|
| 7,893,710 B2* | 2/2011 | Lee | H04L 25/0278 |
| | | | 326/30 |
| 8,344,751 B2* | 1/2013 | Cho | H04L 25/0278 |
| | | | 326/30 |
| 8,471,602 B2* | 6/2013 | Lee | H03K 19/018528 |
| | | | 326/85 |
| 9,748,956 B2 | 8/2017 | Lee et al. | |
| 10,354,703 B2* | 7/2019 | Jung | G11C 29/028 |
| 10,715,364 B2 | 7/2020 | Hollis | |
| 10,748,585 B2 | 8/2020 | Choi | |
| 10,841,138 B2 | 11/2020 | Farzan et al. | |
| 10,886,918 B2 | 1/2021 | Johnson | |
| 10,897,382 B2 | 1/2021 | Kim et al. | |
| 10,938,392 B2 | 3/2021 | Jeong et al. | |
| 11,115,021 B2* | 9/2021 | Kim | G11C 8/10 |
| 11,145,355 B2* | 10/2021 | Kim | G11C 7/1051 |
| 11,875,873 B2* | 1/2024 | Song | G11C 7/1048 |
| 2017/0099050 A1* | 4/2017 | Lee | G11C 7/1057 |

\* cited by examiner

| Data State | P1 | P2 | P3 | N1 | N2 | N3 | Data Level |
|---|---|---|---|---|---|---|---|
| 11 | ON | ON | ON | OFF | OFF | OFF | 3/6×VDD |
| 10 | OFF | ON | ON | OFF | OFF | ON | 2/6×VDD |
| 01 | OFF | OFF | ON | OFF | ON | ON | 1/6×VDD |
| 00 | OFF | OFF | OFF | ON | ON | ON | 0×VDD |

| TMRS | PU | PD | ZQ Loop | | ZQ Time | Linearity |
|---|---|---|---|---|---|---|
| | | | PU | PD | | |
| 0 | Linear | Linear | 1 cycle | 1 cycle | Best | Good |
| 1 | Non-Linear | Linear | 3 cycle | 1 cycle | Good | Good |
| 2 | Linear | Non-Linear | 1 cycle | 3 cycle | Good | Good |
| 3 | Non-Linear | Non-Linear | 3 cycle | 3 cycle | Worst | Best |

| Data State | P1 | P2 | P3 | N1 | N2 | N3 | Data Level |
|---|---|---|---|---|---|---|---|
| 11 | ON | ON | ON | OFF | OFF | OFF | 6/6×VDD |
| 10 | OFF | ON | ON | OFF | OFF | ON | 5/6×VDD |
| 01 | OFF | OFF | ON | OFF | ON | ON | 4/6×VDD |
| 00 | OFF | OFF | OFF | ON | ON | ON | 3/6×VDD |

MEMORY DEVICE AND METHOD FOR CALIBRATING THE DEVICE AND FABRICATING THE DEVICE

CROSS-REFERENCE TO RELATED APPLICATION

This application claims priority from Korean Patent Application No. 10-2021-0151198 filed on Nov. 5, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a memory device and a method for calibrating the memory device and fabricating the memory device.

2. Description of the Related Art

In a multi-level signal system of pulse amplitude modulation (PAM)-N(N being a natural number greater than or equal to 3), ZQ calibration of a transmission driver may be performed in a manner that shares codes of a pull-up circuit and a pull-down circuit. Thermometer type transmission drivers set a driver output resistor code for each level.

SUMMARY

Aspects of embodiments provide a method for calibrating a memory device capable of performing ZQ calibration at higher speed while ensuring linearity.

Aspects of embodiments also provide a method for fabricating a memory device capable of performing ZQ calibration at higher speed while ensuring linearity.

Aspects of embodiments also provide a memory device capable of performing ZQ calibration at higher speed while ensuring linearity.

According to some aspects of embodiments, there is provided a method for calibrating a memory device includes measuring a linearity of a first pull-up circuit, a second pull-up circuit, a third pull-up circuit, a first pull-down circuit, a second pull-down circuit and a third pull-down circuit using an initial pull-up code and an initial pull-down code to obtain a measurement result, each of the first pull-up circuit, the second pull-up circuit and the third pull-up circuit having a respective resistance value determined based on a respective pull-up code, and each of the first pull-down circuit, the second pull-down circuit and the third pull-down circuit having a respective resistance value determined based on a respective pull-down code, and determining a calibration setting indicator based on the measurement result, the calibration setting indicator indicating a calibration method of a transmission driver including the first pull-up circuit, the second pull-up circuit, the third pull-up circuit, the first pull-down circuit, the second pull-down circuit and the third pull-down circuit.

According to some aspects of embodiments, there is provided a method for fabricating a memory device including measuring a linearity of a first pull-up circuit, a second pull-up circuit, a third pull-up circuit, a first pull-down circuit, a second pull-down circuit and a third pull-down circuit to obtain a measurement result, each of the first pull-up circuit, the second pull-up circuit and the third pull-up circuit having a respective resistance value determined based on a respective pull-up code, and each of the first pull-down circuit, the second pull-down circuit and the third pull-down circuit having a respective resistance value determined based on a respective pull-down code, determining a calibration method of a transmission driver based on the measurement result, the transmission driver including the first pull-up circuit, the second pull-up circuit, the third pull-up circuit, the first pull-down circuit, the second pull-down circuit and the third pull-down circuit, determining the respective pull-up code of each of the first pull-up circuit, the second pull-up circuit and the third pull-up circuit based on the calibration method, and determining the respective pull-down code of each of the first pull-down circuit, the second pull-down circuit and the third pull-down circuit based on the calibration method.

According to some aspects of embodiments, there is provided a memory device includes a transmission driver configured to output a multi-level signal, and a memory storing a calibration setting indicator, wherein the transmission driver comprises a first pull-up circuit, a second pull-up circuit and a third pull-up circuit, each of the first pull-up circuit, the second pull-up circuit and the third pull-up circuit having a respective resistance value determined based on a respective pull-up code, and a first pull-down circuit, a second pull-down circuit and a third pull-down circuit, each of the first pull-down circuit, the second pull-down circuit and the third pull-down circuit having a respective resistance value determined based on a respective pull-down code, wherein the calibration setting indicator indicates a method of setting the respective pull-up code and the respective pull-down code.

However, aspects of embodiments are not restricted to those set forth herein. The above and other aspects of embodiments will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Hereinafter, embodiments of the present disclosure will be described with reference to the accompanying drawings.

Figure 1:
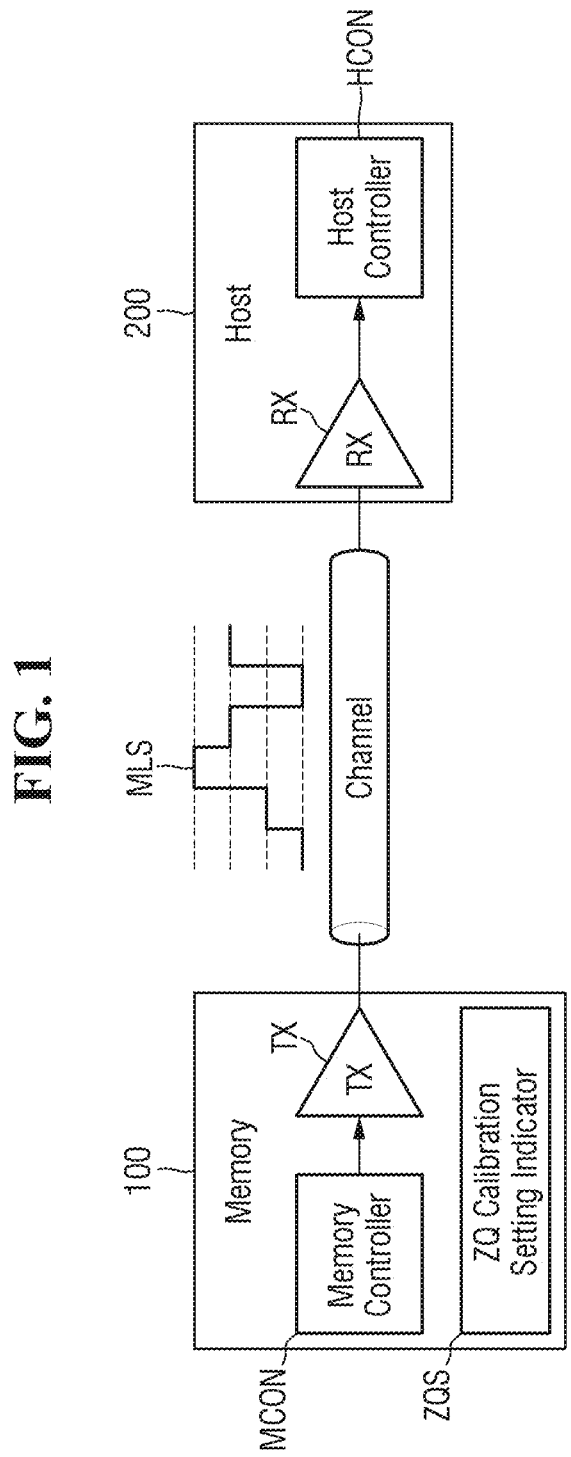
FIG. 1 shows a memory system according to embodiments.

FIG. 1 shows a memory system according to embodiments.

Referring to FIG. 1, a memory system includes a memory device 100 and a host device 200.

The memory device 100 may include storage media for storing data according to a request from the host device 200. In embodiments, the memory device 100 may include a dynamic random memory (DRAM), but embodiments are not limited thereto.

The memory device 100 may include a memory controller MCON, a transmission driver TX, and/or a ZQ calibration setting indicator ZQS. In embodiments, the memory device 100 may further include more components (not illustrated) for storing data according to a request from the host device 200.

The memory controller MCON may control the overall operation of the memory device 100. The memory controller MCON may perform various controls used for read, write, and/or erase operations of the memory device 100.

The transmission driver TX may output a multi-level signal MLS to a channel. In the present disclosure, the multi-level signal MLS refers to a signal having any one of at least three signal levels.

For example, when the memory system performs communication using PAM-3, the multi-level signal MLS is transmitted to have any one of first to third signal levels. Further, when the memory system performs communication using PAM-4, the multi-level signal MLS is transmitted to have any one of first to fourth signal levels.

For example, when the memory system performs communication using PAM-N(N being a natural number equal to or greater than 3), the multi-level signal MLS is transmitted to have any one of first to $N^{th}$ signal levels.

Hereinafter, for example, embodiments of the present disclosure in which the memory system performs communication using PAM-4 will be described, but embodiments are not limited to the following examples.

Figure 2:
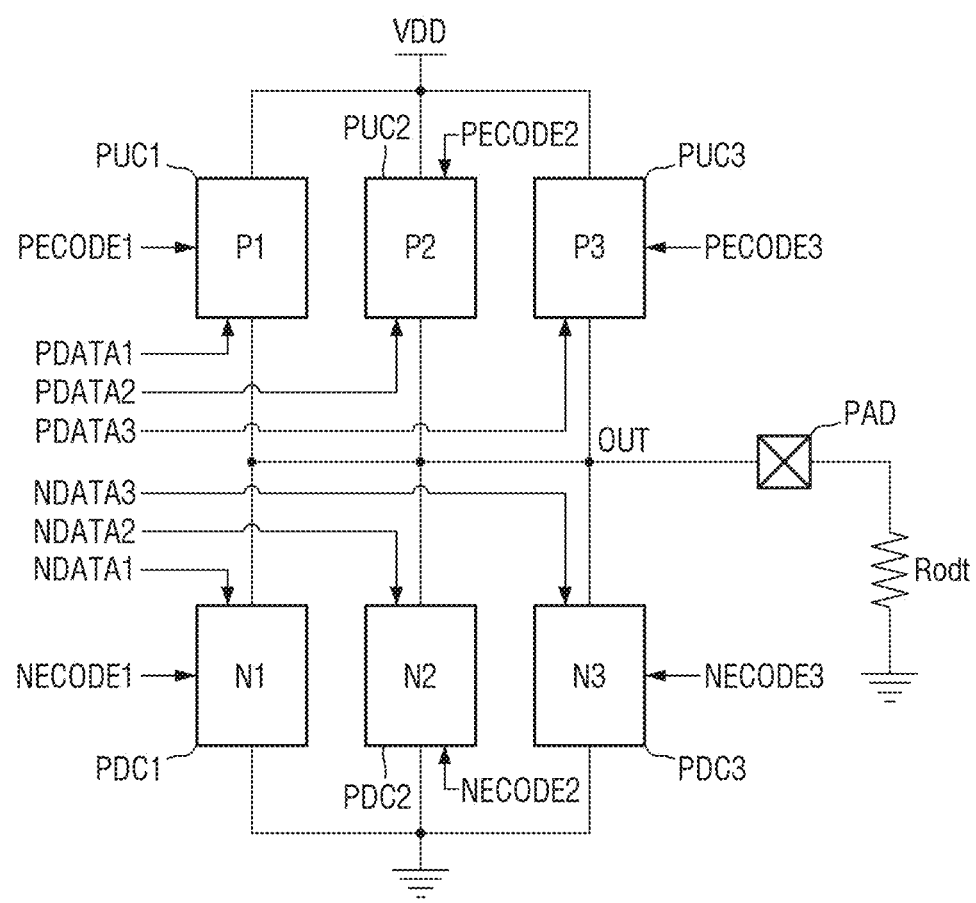
FIG. 2 is a diagram illustrating a transmission driver of FIG. 1.
Figure 3:
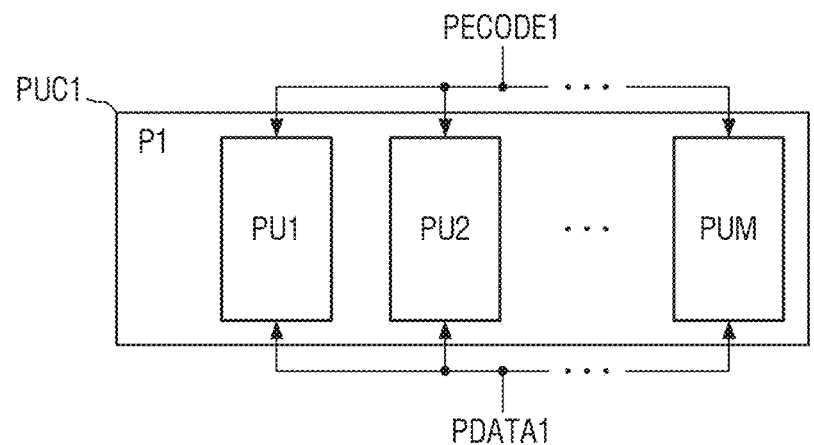
FIG. 3 is a diagram illustrating a pull-up circuit of FIG. 2.
Figure 5:
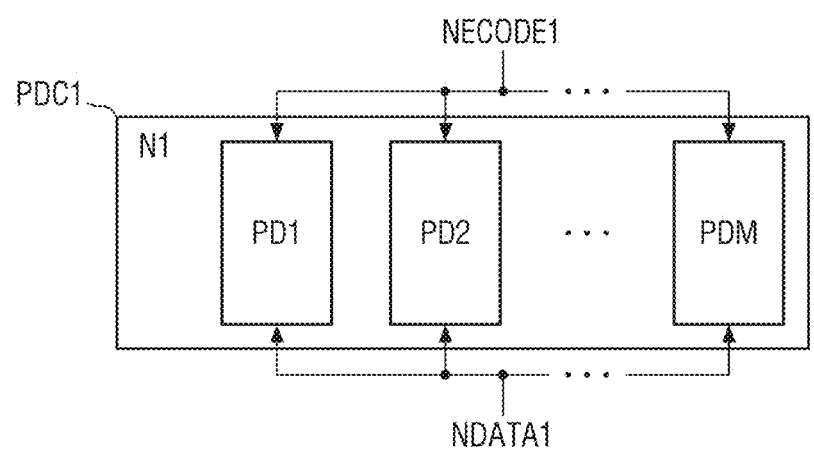
FIG. 5 is a diagram illustrating a pull-down circuit of FIG. 2.
Figure 6A:
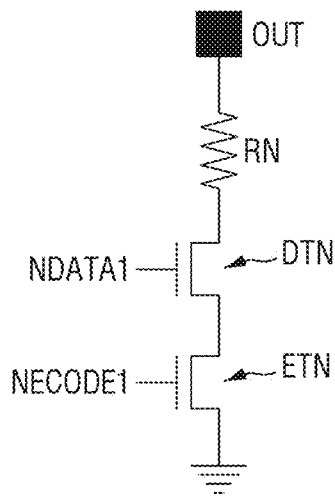
FIGS. 6A and 6B are diagrams illustrating a pull-down unit of FIG. 5.
Figure 6B:
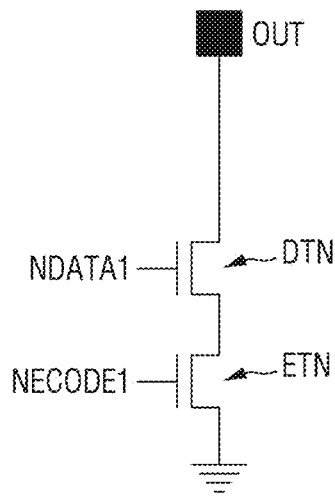

FIG. 2 is a diagram illustrating a transmission driver of FIG. 1. FIG. 3 is a diagram illustrating a pull-up circuit of FIG. 2. FIGS. 4A to 4D are diagrams illustrating a pull-up unit of FIG. 3. FIG. 5 is a diagram illustrating a pull-down circuit of FIG. 2. FIGS. 6A and 6B are diagrams illustrating a pull-down unit of FIG. 5.

Referring to FIG. 2, the transmission driver TX may include pull-up circuits PUC1, PUC2, and/or PUC3 and pull-down circuits PDC1, PDC2, and/or PDC3. In embodiments, the transmission driver TX may be a thermometer type transmission driver.

In the FIG. 2, three pull-up circuits PUC1, PUC2, and PUC3 and three pull-down circuits PDC1, PDC2, and PDC3 are illustrated as an example of performing communication using PAM-4, but embodiments are not limited to the illustrated example.

For 2-bit data intended to be transmitted by the transmission driver TX, a 1-bit pull-up data signal PDATA1, a 1-bit pull-up data signal PDATA2, and a 1-bit pull-up data signal PDATA3 may be generated. However, embodiments are not limited thereto. For example, when communication is performed using PAM-N, the transmission driver TX may include (N−1) pull-up circuits and (N−1) pull-down circuits.

The pull-up data signal PDATA1 may determine whether the pull-up circuit PUC1 is turned on, the pull-up data signal PDATA2 may determine whether the pull-up circuit PUC2 is turned on, and the pull-up data signal PDATA3 may determine whether the pull-up circuit PUC3 is turned on.

A pull-up ZQ code PECODE1 may be provided to the pull-up circuit PUC1. When the pull-up circuit PUC1 is turned on, the pull-up ZQ code PECODE1 may determine the number of pull-up units enabled in the pull-up circuit PUC1, thereby determining the resistance value of the pull-up circuit PUC1.

A pull-up ZQ code PECODE2 may be provided to the pull-up circuit PUC2. When the pull-up circuit PUC2 is turned on, the pull-up ZQ code PECODE2 may determine the number of pull-up units enabled in the pull-up circuit PUC2, thereby determining the resistance value of the pull-up circuit PUC2.

A pull-up ZQ code PECODE3 may be provided to the pull-up circuit PUC3. When the pull-up circuit PUC3 is turned on, the pull-up ZQ code PECODE3 may determine the number of pull-up units enabled in the pull-up circuit PUC3, thereby determining the resistance value of the pull-up circuit PUC3.

In embodiments, the pull-up ZQ codes PECODE1, PECODE2, and PECODE3 may be independent of each other. Accordingly, the pull-up circuits PUC1, PUC2, and PUC3 may have resistance values independent of each other.

Referring to FIG. 3, the pull-up circuit PUC1 may include a plurality of pull-up units PU1 to PUM that are enabled based on the pull-up ZQ code PECODE1. Although not illustrated in detail, the pull-up circuit PUC2 and the pull-up circuit PUC3 may also have the same configuration or similar configurations.

The number of pull-up units PU1 to PUM included in the pull-up circuit PUC1 may be related to the number of bits of the pull-up ZQ code PECODE1. For example, when the number of bits of the pull-up ZQ code PECODE1 is 5 bits, the pull-up circuit PUC1 may include 31 pull-up units PU1 to PUM (e.g., M=31). According to embodiments, the number of pull-up units may be $(2^{\text{Number of bits in the pull-up ZQ code}} - 1)$.

The pull-up ZQ code PECODE1 may determine the number of pull-up units PU1 to PUM enabled among the pull-up units PU1 to PUM included in the pull-up circuit PUC1.

Figure 4A:
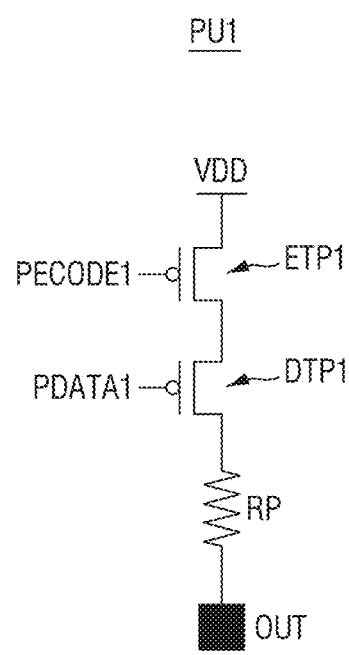
FIGS. 4A to 4D are diagrams illustrating a pull-up unit of FIG. 3.

For example, when the pull-up unit is configured with a PMOS transistor as illustrated in FIG. 4A, and the pull-up ZQ code PECODE1 is 5 bits having a value of 11111, the 31 pull-up units PU1 to PUM included in the pull-up circuit PUC1 may all be disabled.

For example, when the pull-up unit is configured with a PMOS transistor as illustrated in FIG. 4A, and the pull-up ZQ code PECODE1 is 5 bits having a value of 11110, one pull-up unit (e.g., PU1) among 31 pull-up units PU1 to PUM included in the pull-up circuit PUC1 may be enabled, and the other pull-up units PU2 to PUM may be disabled.

For example, when the pull-up unit is configured with a PMOS transistor as illustrated in FIG. 4A, and the pull-up ZQ code PECODE1 is 5 bits having a value of 00000, the 31 pull-up units PU1 to PUM included in the pull-up circuit PUC1 may all be enabled.

As described above, since the pull-up ZQ codes PECODE1, PECODE2, are PECODE3 are codes independent of each other, the number of pull-up units PU1 to PUM enabled in each of the pull-up circuits PUC1, PUC2, and PUC3 may be independent. For example, when the pull-up ZQ codes PECODE1, PECODE2, and PECODE3 are each 5 bits and their values are different from each other, the number of pull-up units PU1 to PUM enabled in the pull-up circuit PUC1, the number of pull-up units PU1 to PUM enabled in the pull-up circuit PUC2, and the number of pull-up units PU1 to PUM enabled in the pull-up circuit PUC3 may be different from each other.

Referring to FIG. 4A, the pull-up unit PU1 may include a pull-up enable transistor ETP1 configured as a PMOS transistor, a pull-up data transistor DTP1 configured as a PMOS transistor, and a pull-up resistor RP.

The pull-up enable transistor ETP1 may be turned on based on the pull-up ZQ code PECODE1, and the pull-up data transistor DTP1 may be turned on based on the pull-up data signal PDATA1.

Figure 4B:
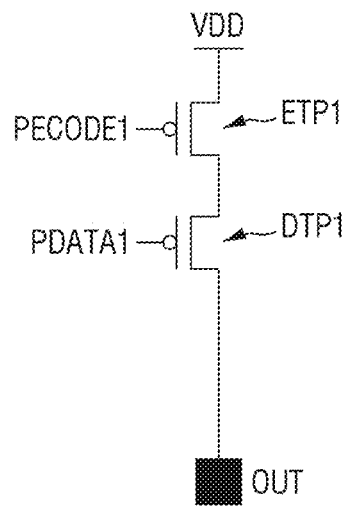

In embodiments, the pull-up unit PU1 may also be implemented by omitting the pull-up resistor RP as illustrated in FIG. 4B. In addition, although only the structure of the pull-up unit PU1 is illustrated in the drawing, the other pull-up units PU2 to PUM that are not illustrated may also have the same structure or similar structures.

Figure 4C:
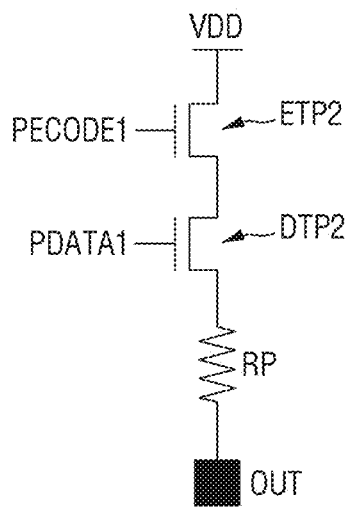

Referring to FIG. 4C, the pull-up unit PU1 may include a pull-up enable transistor ETP2 configured as an NMOS transistor, a pull-up data transistor DTP2 configured as an NMOS transistor, and the pull-up resistor RP. The pull-up enable transistor ETP1 may be turned on based on the pull-up ZQ code PECODE1, and the pull-up data transistor DTP1 may be turned on based on the pull-up data signal PDATA1. Although only the structure of the pull-up unit PU1 is illustrated in the drawing, the other pull-up units PU2 to PUM that are not illustrated may also have the same structure or similar structures.

As such, when the pull-up enable transistor ETP2 and the pull-up data transistor DTP2 are configured as NMOS transistors, for example, when the pull-up ZQ code PECODE1 is 5 bits having a value of 00000, the 31 pull-up units PU1 to PUM included in the pull-up circuit PUC1 may all be disabled. In addition, for example, when the pull-up enable transistor ETP2 and the pull-up data transistor DTP2 are configured as NMOS transistors, the pull-up ZQ code PECODE1 is 5 bits having a value of 11111, the 31 pull-up units PU1 to PUM included in the pull-up circuit PUC1 may all be enabled.

Figure 4D:
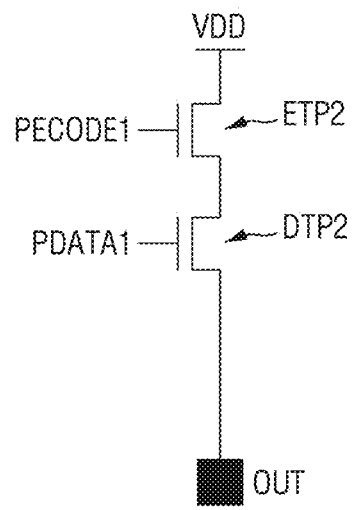

In embodiments, the pull-up unit PU1 may be implemented by omitting the pull-up resistor RP as illustrated in FIG. 4D.

Referring back to FIG. 2, pull-down data signals NDATA1 to NDATA3 may be generated according to data intended to be transmitted by the transmission driver TX. In embodiments, for 2-bit data intended to be transmitted by the transmission driver TX, a 1-bit pull-down data signal NDATA1, a 1-bit pull-down data signal NDATA2, and a 1-bit pull-down data signal NDATA3 may be generated, but embodiments are not limited thereto.

The pull-down data signal NDATA1 may determine whether the pull-down circuit PDC1 is turned on, the pull-down data signal NDATA2 may determine whether the pull-down circuit PDC2 is turned on, and the pull-down data signal NDATA3 may determine whether the pull-down circuit PDC3 is turned on.

The pull-down ZQ code NECODE1 may be provided to the pull-down circuit PDC1. When the pull-down circuit PDC1 is turned on, the pull-down ZQ code NECODE1 may determine the number of pull-down units enabled in the pull-down circuit PDC1, thereby determining the resistance value of the pull-down circuit PDC1.

The pull-down ZQ code NECODE2 may be provided to the pull-down circuit PDC2. When the pull-down circuit PDC2 is turned on, the pull-down ZQ code NECODE2 may determine the number of pull-down units enabled in the pull-down circuit PDC2, thereby determining the resistance value of the pull-down circuit PDC2.

The pull-down ZQ code NECODE3 may be provided to the pull-down circuit PDC3. When the pull-down circuit PDC3 is turned on, the pull-down ZQ code NECODE3 may determine the number of pull-down units enabled in the pull-down circuit PDC3, thereby determining the resistance value of the pull-down circuit PDC3.

In embodiments, the pull-down ZQ codes NECODE1, NECODE2, and NECODE3 may be independent of each other. Accordingly, the pull-down circuits PDC1, PDC2, and PDC3 may have resistance values independent of each other when they are turned on.

Referring to FIG. 5, the pull-down circuit PDC1 may include a plurality of pull-down units PD1 to PDM that are enabled based on the pull-down ZQ code NECODE1. Although not illustrated in detail, the pull-down circuit PDC2 and the pull-down circuit PDC3 may also have the same configuration or similar configurations.

The number of pull-down units PD1 to PDM included in the pull-down circuit PDC1 may be related to the number of bits of the pull-down ZQ code NECODE1. For example, when the number of bits of the pull-down ZQ code NECODE1 is 5 bits, the pull-down circuit PDC1 may include 31 pull-down units PD1 to PDM (e.g., M=31). According to embodiments, the number of pull-up units may be ($2^{Number\ of\ bits\ in\ the\ pull\text{-}down\ ZQ\ code} - 1$).

In embodiments, the number of pull-up units included in the pull-up circuits PUC1, PUC2, and PUC3 may be the same as, or similar to, the number of pull-down units included in the pull-down circuits PDC1, PDC2, and PDC3.

The pull-down ZQ code NECODE1 may determine the number of pull-down units PD1 to PDM enabled among the pull-down units PD1 to PDM included in the pull-down circuit PDC1.

For example, when the pull-down ZQ code NECODE1 is 5 bits having a value of 00000, the 31 pull-down units PD1 to PDM included in the pull-down circuit PDC1 may all be disabled.

For example, when the pull-down ZQ code NECODE1 is 5 bits having a value of 00010, two pull-down units (e.g., PD1 and PD2) of the 31 pull-down units PD1 to PDM included in the pull-down circuit PDC1 may be enabled, and the remaining pull-down units (e.g., PD3 to PDM) may be disabled.

For example, when the pull-down ZQ code NECODE1 is 5 bits having a value of 11111, the 31 pull-down units PD1 to PDM included in the pull-down circuit PDC1 may all be enabled.

As described above, since the pull-down ZQ codes NECODE1, NECODE2, and NECODE3 are codes independent of each other, the number of pull-down units PD1 to PDM enabled in each of the pull-down circuits PDC1, PDC2, and PDC3 may be independent. For example, when the pull-down ZQ codes NECODE1, NECODE2, and NECODE3 are each 5 bits and their values are different from each other, the number of pull-down units PD1 to PDM enabled in the pull-down circuit PDC1, the number of pull-down units PD1 to PDM enabled in the pull-down circuit PDC2, and the number of pull-down units PD1 to PDM enabled in the pull-down circuit PDC3 may be different from each other.

Referring to FIG. 6A, the pull-down unit PD1 may include a pull-down enable transistor ETN, a pull-down data transistor DTN, and a pull-down resistor RN.

Although only the structure of the pull-down unit PD1 is illustrated in the drawing, the other pull-down units PD2 to PDM that are not illustrated may also have the same structure or similar structures. In embodiments, the pull-down unit PD1 may be implemented by omitting the pull-down resistor RN as illustrated in FIG. 6B. The pull-down enable transistor ETN may be turned on based on the pull-down ZQ code NECODE1, and the pull-down data transistor DTN may be turned on based on the pull-down data signal NDATA1.

Referring to FIG. 2, as an on-resistance Ron of the pull-up circuits PUC1, PUC2, and PUC3 and the pull-down circuits PDC1, PDC2, and PDC3 is adjusted, the voltage distributed from the power voltage VDD may be applied to an output node OUT, and the voltage may be outputted to an output pad PAD to output a multi-level signal from the transmission driver TX. In embodiments, the on-resistances of the pull-up circuits PUC1, PUC2, and PUC3 and the pull-down circuits PDC1, PDC2, and PDC3 may be adjusted to match impedance with an on die termination (ODT) resistor Rodt.

Hereinafter, an operation in which the on-resistances of the pull-up circuits PUC1, PUC2, and PUC3 and the pull-down circuits PDC1, PDC2, and PDC3 are adjusted and the transmission driver TX outputs a multi-level signal will be described with reference to FIGS. 7 and 8.

Figures 7, 8:
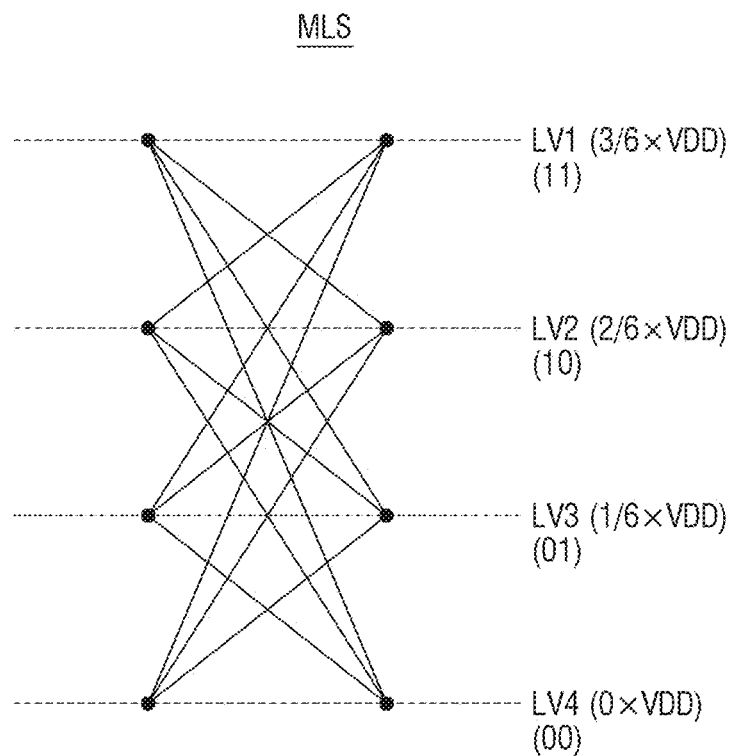
FIGS. 7 and 8 are diagrams for describing an operation in which the transmission driver of FIG. 1 generates a multi-level signal.

FIGS. 7 and 8 are diagrams for describing an operation in which the transmission driver of FIG. 1 generates a multi-level signal.

Referring to FIGS. 2, 7 and 8, the transmission driver TX may output the multi-level signal MLS as the pull-up circuits PUC1 to PUC3 are turned on or off by the pull-up data signals PDATA1 to PDATA3, respectively, and the pull-down circuits PDC1 to PDC3 are turned on or off by the pull-down data signals NDATA1 to NDATA3, respectively. Hereinafter, in order to describe the operation, an example is provided in which a resistance when each of the pull-up circuits PUC1, PUC2, and PUC3 is enabled is 120Ω and a resistance when each of the pull-down circuits PDC1, PDC2, and PDC3 is enabled is 120Ω. In addition, a case in which the ODT resistance Rodt of a GND termination method is 40Ω will be described as an example.

When the configuration of the transmission driver TX is as shown in FIG. 2, the signal level of the multi-level signal MLS received by a reception driver RX of the host device 200 may be expressed as Eq. 1 below.

$$\text{Signal level}=(Rpd\|\text{Rodt}/(Rpu+(Rpd\|\text{Rodt})))*Vdd \quad \text{Eq. 1}$$

Here, Rpd is the resistance value of the pull-down circuit (e.g., the collective resistance of the enabled pull-up circuits), Rpu is the resistance value of the pull-up circuit (e.g., the collective resistance of the enabled pull-down circuits), and Rodt is the resistance value of the ODT resistor. Rpd∥Rodt is the parallel resistance value of Rpd and Rodt.

Referring to FIGS. 2, 7 and 8, when the data outputted from the transmission driver TX is 11, the pull-up data signals PDATA1 to PDATA3 enabling (e.g., turning on) all of the pull-up circuits PUC1, PUC2, and PUC3 and the pull-down data signals NDATA1 to NDATA3 disabling (e.g., turning off) all of the pull-down circuits PDC1, PDC2 and PDC3 are generated.

Accordingly, all of the pull-up circuits PUC1, PUC2, and PUC3 are enabled, and all of the pull-down circuits PDC1, PDC2, and PDC3 are disabled. Accordingly, the Rpu value becomes 40Ω, Rpd∥Rodt becomes 40Ω, and the multi-level signal MLS has a signal level LV1 of 40Ω/(40Ω+40Ω)*Vdd=½*Vdd.

Next, when the data outputted from the transmission driver TX is 10, the pull-up data signals PDATA1 to PDATA3 and the pull-down data signals NDATA1 to NDATA3 that enable the pull-up circuits PUC2 and PUC3 and the pull-down circuit PDC3 and disable the pull-up circuit PUC1 and the pull-down circuits PDC1 and PDC2 are generated.

Accordingly, the pull-up circuits PUC2 and PUC3 and the pull-down circuit PDC3 are enabled, and the pull-up circuit PUC1 and the pull-down circuits PDC1 and PDC2 are disabled. Accordingly, the Rpu value becomes 60Ω, Rpd∥Rodt becomes 30Ω, and the multi-level signal MLS has a signal level LV2 of 30Ω/(60Ω+30Ω)*Vdd=⅓*Vdd.

Next, when the data outputted from the transmission driver TX is 01, the pull-up data signals PDATA1 to PDATA3 and the pull-down data signals NDATA1 to NDATA3 that enable the pull-up circuit PUC3 and the pull-down circuits PDC2 and PDC3 and disable the pull-up circuits PUC1 and PUC2 and the pull-down circuit PDC1 are generated.

Accordingly, the pull-up circuit PUC3 and the pull-down circuits PDC2 and PDC3 are enabled, and the pull-up circuits PUC1 and PUC2 and the pull-down circuit PDC1 are disabled. Accordingly, the Rpu value becomes 120Ω, Rpd∥Rodt becomes 24Ω, and the multi-level signal MLS has a signal level LV3 of 24Ω/(120Ω+24Ω)*Vdd=⅙*Vdd.

Next, when data outputted from the transmission driver TX is 00, the pull-up data signals PDATA1 to PDATA3 and the pull-down data signals NDATA1 to NDATA3 that disable all of the pull-up circuits PUC1, PUC2, and PUC3 and enable all of the pull-down circuits PDC1, PDC2, and PDC3 are generated.

Accordingly, all of the pull-up circuits PUC1, PUC2, and PUC3 are disabled, and all of the pull-down circuits PDC1, PDC2, and PDC3 are enabled. All of the pull-up circuits PUC1, PUC2, and PUC3 are disabled, so that the multi-level signal MLS has a signal level LV4 of 0*Vdd.

As such, the signal level of the multi-level signal MLS may be determined by the on-resistance of the pull-up circuits PUC1, PUC2, and PUC3 and the pull-down circuits PDC1, PDC2, and PDC3.

Referring back to FIG. 1, the host device 200 may include the reception driver RX and a host controller HCON. In embodiments, the host device 200 may include more components not illustrated.

In embodiments, the host device 200 may be an application processor or any one of a plurality of modules included in the application processor, and the application processor may be implemented as a system-on-chip (SoC). In addition, in embodiments, the memory device 100 and the host device 200 may be implemented as a system-on-chip.

The reception driver RX may receive the multi-level signal MLS transmitted through a channel from the memory device 100. According to embodiments, the channel may be a wired or wireless communication channel.

The host controller HCON may control the overall operation of the host device 200. In addition, the host controller HCON may apply a command such as a read command or a write command to the memory device 100.

In a ZQ calibration process, the ZQ calibration setting indicator ZQS of the memory device 100 may indicate a method of setting the pull-up ZQ codes PECODE1, PECODE2, and PECODE3, and the pull-down ZQ codes NECODE1, NECODE2, and NECODE3, of the transmission driver TX described above.

In embodiments, the ZQ calibration setting indicator ZQS may store information in the form of a test mode register set (TMRS). Further, in embodiments, the ZQ calibration setting indicator ZQS may store information through a fused fuse. Hereinafter, embodiments in which the ZQ calibration setting indicator ZQS stores information in the form of a test mode register set (TMRS) will be described, but embodiments are not limited thereto. According to embodiments, the ZQ calibration setting indicator ZQS may perform the operation of storing information (e.g., the TMRS), or may be the information stored.

Figure 9:
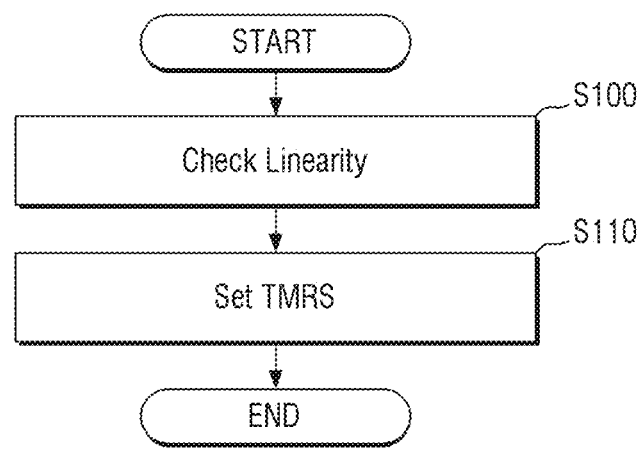
FIG. 9 is a flowchart illustrating a method of setting a ZQ calibration setting indicator at a wafer level.
Figure 10:
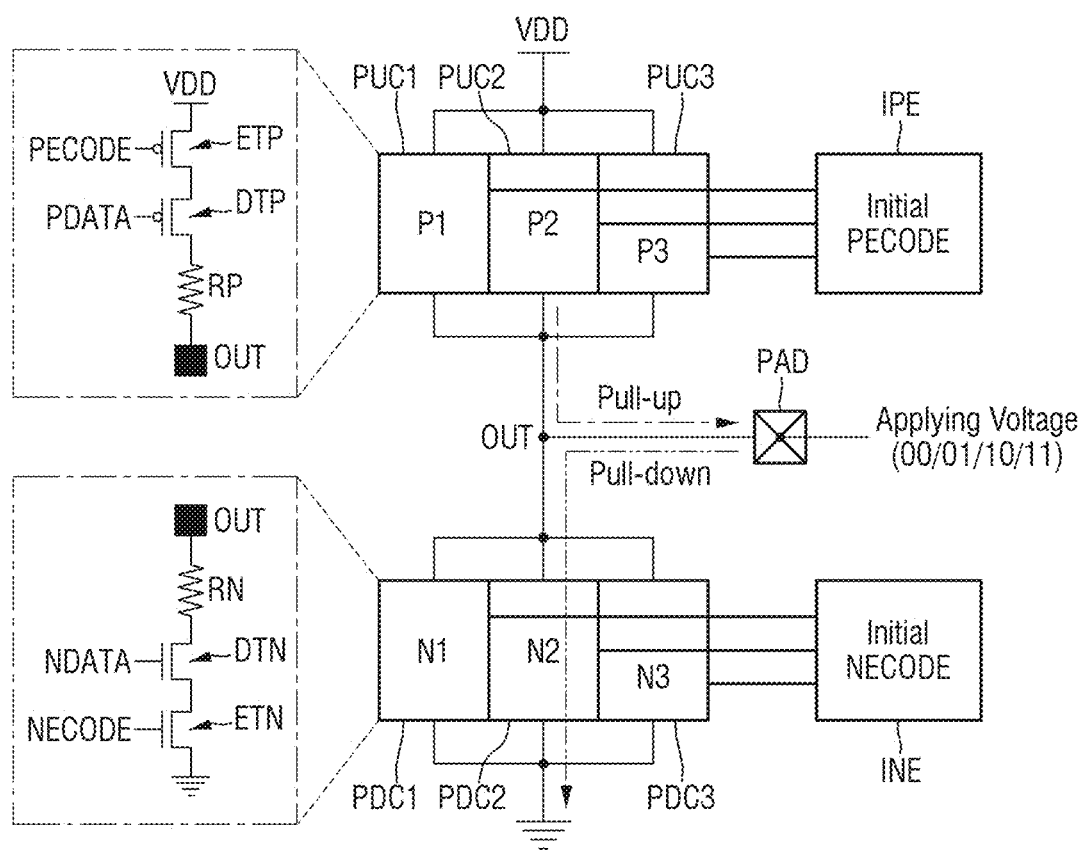
FIGS. 10 to 12 are diagrams illustrating the method of FIG. 9.
Figures 11, 12:
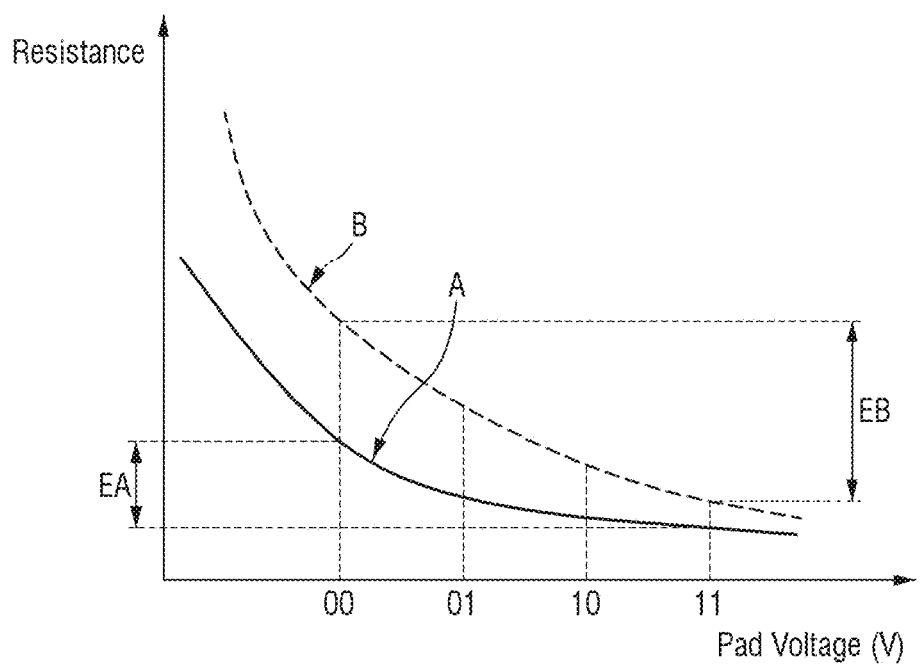

FIG. 9 is a flowchart illustrating a method of setting a ZQ calibration setting indicator at a wafer level. FIGS. 10 to 12 are diagrams illustrating the method of FIG. 9.

The pull-up ZQ codes PECODE1, PECODE2, and PECODE3 and the pull-down ZQ codes NECODE1, NECODE2, and NECODE3 described above may be determined and set during a process of packaging the memory device.

In embodiments, the ZQ calibration setting indicator is set in a wafer level operation before the memory device is packaged, and the ZQ calibration setting indicator set in the wafer level operation is used to determine and set the pull-up ZQ codes PECODE1, PECODE1, PECODE2, and PECODE3 and the pull-down ZQ codes NECODE1, NECODE2, and NECODE3 later in the packaging operation.

Referring to FIG. 9, in the wafer level operation, the linearity of the pull-up circuits PUC1, PUC2, and PUC3 and the pull-down circuits PDC1, PDC2, and PDC3 is checked (operation S100). In embodiments, the wafer level operation may include testing a memory chip disposed on the wafer using automatic test equipment.

Here, the fact that the pull-up circuits PUC1, PUC2, and PUC3 and the pull-down circuits PDC1, PDC2, and PDC3 are linear means that signal levels generated using the pull-up circuits PUC1, PUC2, and PUC3 and the pull-down circuits PDC1, PDC2, and PDC3 are close (e.g., within a threshold amount) to target signal levels LV1 to LV4 of the multi-level signal MLS shown in FIG. 7. That is, it means that the pull-up circuits PUC1, PUC2, and PUC3 and the pull-down circuits PDC1, PDC2, and PDC3 may accurately generate a target signal level.

Conversely, the fact that the pull-up circuits PUC1, PUC2, and PUC3 and the pull-down circuits PDC1, PDC2, and PDC3 are non-linear means that signal levels generated using the pull-up circuits PUC1, PUC2, and PUC3 and the pull-down circuits PDC1, PDC2, and PDC3 are different (e.g., not within the threshold amount) from target signal levels LV1 to LV4 of the multi-level signal MLS shown in FIG. 7. That is, it means that the pull-up circuits PUC1, PUC2, and PUC3 and the pull-down circuits PDC1, PDC2, and PDC3 do not accurately generate a target signal level.

The linearity of the pull-up circuits PUC1, PUC2, and PUC3 and the pull-down circuits PDC1, PDC2, and PDC3 may, as shown in FIG. 10, be checked by applying a voltage corresponding to each signal level of the multi-level signal to the output pad PAD and measuring the resistances of the pull-up circuits PUC1, PUC2, and PUC3 and the pull-down circuits PDC1, PDC2, and PDC3.

This process is described in more detail as follows.

First, an initial pull-up ZQ code IPE and an initial pull-down ZQ code INE are determined.

In embodiments, when the number of bits of the pull-up ZQ code is 5 bits and the number of bits of the pull-down ZQ code is 5 bits, the initial pull-up ZQ code IPE and the initial pull-down ZQ code INE may be determined as 10000, which is an intermediate value between 00000 and 11111.

In addition, in embodiments, the initial pull-up ZQ code IPE and the initial pull-down ZQ code INE may be determined in consideration of process variations. The memory device in the wafer level operation may be in a state manufactured with process variations already reflected, and in embodiments, the initial pull-up ZQ code IPE and the initial pull-down ZQ code INE may be determined by reflecting the variations.

Next, the initial pull-up ZQ code IPE is provided to the pull-up circuits PUC1, PUC2, and PUC3. Accordingly, as many pull-up units as the number corresponding to the initial pull-up ZQ code IPE are enabled in the pull-up circuits PUC1, PUC2, and PUC3, and thus, the pull-up circuits PUC1, PUC2, and PUC3 have a predetermined or alternatively, given resistance value.

Next, the initial pull-down ZQ code INE is provided to the pull-down circuits PDC1, PDC2, and PDC3. Accordingly, as many pull-down units as the number corresponding to the initial pull-down ZQ code INE are enabled in the pull-down circuits PDC1, PDC2, and PDC3, and thus, the pull-down circuits PDC1, PDC2, and PDC3 have a predetermined or alternatively, given resistance value.

Next, voltages corresponding to the signal levels, e.g., 00, 01, 10, and 11 levels are sequentially applied to the output pad PD, and a pull-up current and a pull-down current flowing through the output node OUT are sequentially measured, thereby measuring, as shown in FIG. 11, the resistance value of the pull-up circuits PUC1, PUC2, and PUC3 and the resistance value of the pull-down circuits PDC1, PDC2, and PDC3 for each signal level.

As a result of the measurement, as in line A of FIG. 11, if an error EA of the resistance value corresponding to each signal level is within a predetermined or alternatively, given resistance error range, it is determined to be linear, and as in line B of FIG. 11, if an error EB of the resistance value corresponding to each signal level is out of the predetermined or alternatively, given resistance error range, it is determined to be non-linear.

Next, referring to FIG. 9, the TMRS is set based on the measurement result (operation S110).

Referring to FIGS. 10 and 12, when it is determined that the pull-up circuits PUC1, PUC2, and PUC3 are linear and the pull-down circuits PDC1, PDC2, and PDC3 are also linear, 0 is set as the TMRS value. In this case, when determining the pull-up ZQ codes PECODE1, PECODE2, and PECODE3 and the pull-down ZQ codes NECODE1, NECODE2, and NECODE3 at a packaging level to be described later, only one loop is performed for each. Therefore, it is possible to perform ZQ calibration in a shorter time while obtaining linearity.

Next, when it is determined that the pull-up circuits PUC1, PUC2, and PUC3 are non-linear and the pull-down circuits PDC1, PDC2, and PDC3 are linear, 1 is set as the TMRS value. In this case, the pull-up ZQ codes PECODE1, PECODE2, and PECODE3 will be determined for the pull-up circuits PUC1, PUC2, and PUC3, respectively, at the packaging level to be described later. Accordingly, three loops are performed to determine the pull-up ZQ codes PECODE1, PECODE2, and PECODE3.

On the other hand, when determining the pull-down ZQ codes NECODE1, NECODE2, and NECODE3, only one loop is performed. Accordingly, it is possible to perform ZQ calibration in a shorter time while obtaining linearity.

Next, when it is determined that the pull-up circuits PUC1, PUC2, and PUC3 are linear and the pull-down circuits PDC1, PDC2, and PDC3 are non-linear, 2 is set as the TMRS value. In this case, in the packaging level to be described later, only one loop will be performed to determine the pull-up ZQ codes PECODE1, PECODE2, and PECODE3, but the pull-down ZQ codes NECODE1, NECODE2, and NECODE3 will be determined for the pull-down circuits PDC1, PDC2, and PDC3, respectively. Therefore, three loops are performed to determine the pull-down ZQ codes NECODE1, NECODE2, and NECODE3. Even in this case, it is possible to perform ZQ calibration in a shorter time while obtaining linearity.

Next, when it is determined that the pull-up circuits PUC1, PUC2, and PUC3 are non-linear and the pull-down circuits PDC1, PDC2, and PDC3 are also non-linear, 3 is set as the TMRS value. In this case, the pull-up ZQ codes PECODE1, PECODE2, and PECODE3 will be determined for the pull-up circuits PUC1, PUC2, and PUC3, respectively, at the packaging level to be described later. Accordingly, three loops are performed to determine the pull-up ZQ codes PECODE1, PECODE2, and PECODE3. In addition, the pull-down ZQ codes NECODE1, NECODE2, and NECODE3 will be determined for the pull-down circuits PDC1, PDC2, and PDC3, respectively. Therefore, three loops are performed to determine the pull-down ZQ codes NECODE1, NECODE2, and NECODE3.

In this case, since the pull-up ZQ codes PECODE1, PECODE2, and PECODE3 are determined for the pull-up circuits PUC1, PUC2, and PUC3, respectively, and the pull-down ZQ codes NECODE1, NECODE2, and NECODE3 are determined for the pull-down circuits PDC1, PDC2, and PDC3, respectively, the linearity may be higher. However, since a total of six loops are performed to determine the pull-up ZQ codes PECODE1, PECODE2, and PECODE3 and the pull-down ZQ codes NECODE1, NECODE2, and NECODE3, a time duration during which ZQ calibration (e.g., a ZQ calibration time or ZQ calibration execution time) is excessively long. Therefore, in embodiments, an additional operation is performed at the packaging level in order to shorten the ZQ calibration time.

The TMRS value determined in this way may be stored in the memory device using a method such as fusing (e.g., fusing a fuse).

As such, in a case where the ZQ calibration setting indicator is set in the wafer level operation before the memory device is packaged, and the pull-up ZQ codes and the pull-down ZQ codes are determined and set in the packaging operation using the ZQ calibration setting indicator set in the wafer level operation, the ZQ calibration time may be shortened compared to a case where the pull-up ZQ codes and the pull-down ZQ codes are determined and set in the packaging operation without the ZQ calibration setting indicator.

If there is no such ZQ calibration setting indicator, since determination is performed of the pull-up ZQ codes PECODE1, PECODE2, and PECODE3 for the pull-up circuits PUC1, PUC2, and PUC3, respectively, and the pull-down ZQ codes NECODE1, NECODE2, and NECODE3 for the pull-down circuits PDC1, PDC2, and PDC3, respectively, six loops are performed. However, according to embodiments, it is possible to perform the loop less than 6 times.

Hereinafter, a method of setting the ZQ calibration code at the packaging level will be described with reference to FIGS. 13 to 15. In embodiments, the packaging level operation may include packaging a memory chip or a memory chip with other chips (e.g., SoC chips).

Figure 13:
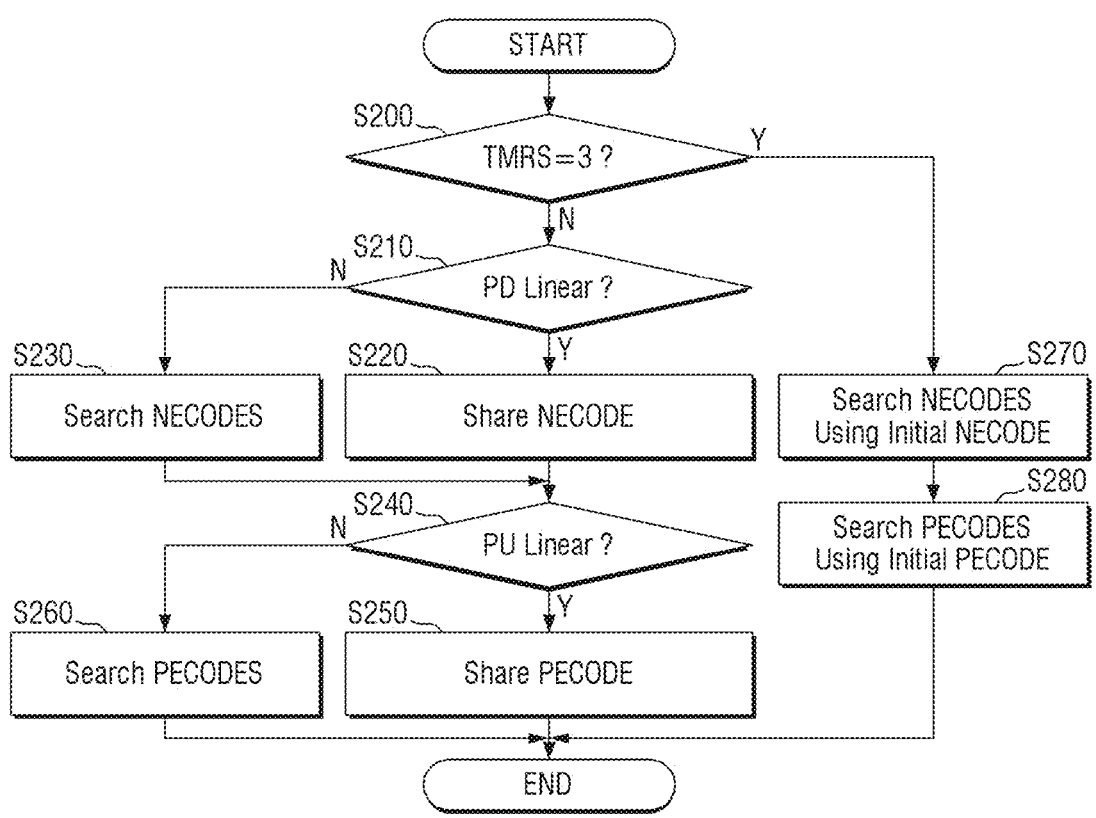
FIG. 13 is a flowchart illustrating a method of setting a ZQ calibration code at a packaging level.

FIG. 13 is a flowchart illustrating a method of setting a ZQ calibration code at a packaging level. FIGS. 14 and 15 are diagrams illustrating the method of FIG. 13.

Referring to FIGS. 2 and 13, it is checked whether the TMRS value, which is the ZQ calibration setting indicator, is 3 (operation S200). That is, it is checked whether the pull-up circuits PUC1, PUC2, and PUC3 and the pull-down circuits PDC1, PDC2, and PDC3 are all non-linear.

First, a case in which the TMRS value is not 3 (N in operation S200) will be described.

It is checked whether the pull-down circuits PDC1, PDC2, and PDC3 are linear (operation S210). That is, it is checked whether the TMRS value is 0 or 1.

If the pull-down circuits PDC1, PDC2, and PDC3 are linear (Y in operation S210), the pull-down circuits PDC1, PDC2, and PDC3 share the initial pull-down ZQ code INE (see FIG. 10) that is previously set (operation S220). That is, all of the pull-down ZQ codes NECODE1, NECODE2, and NECODE3 are set to the initial pull-down ZQ code INE (see FIG. 10). Accordingly, setting of the pull-down ZQ codes NECODE1, NECODE2, and NECODE3 may be completed in one loop.

If the pull-down circuits PDC1, PDC2, and PDC3 are non-linear (N in operation S210), the pull-down ZQ codes NECODE1, NECODE2, and NECODE3 are determined for the pull-down circuits PDC1, PDC2, and PDC3, respectively (operation S230).

Figure 14:
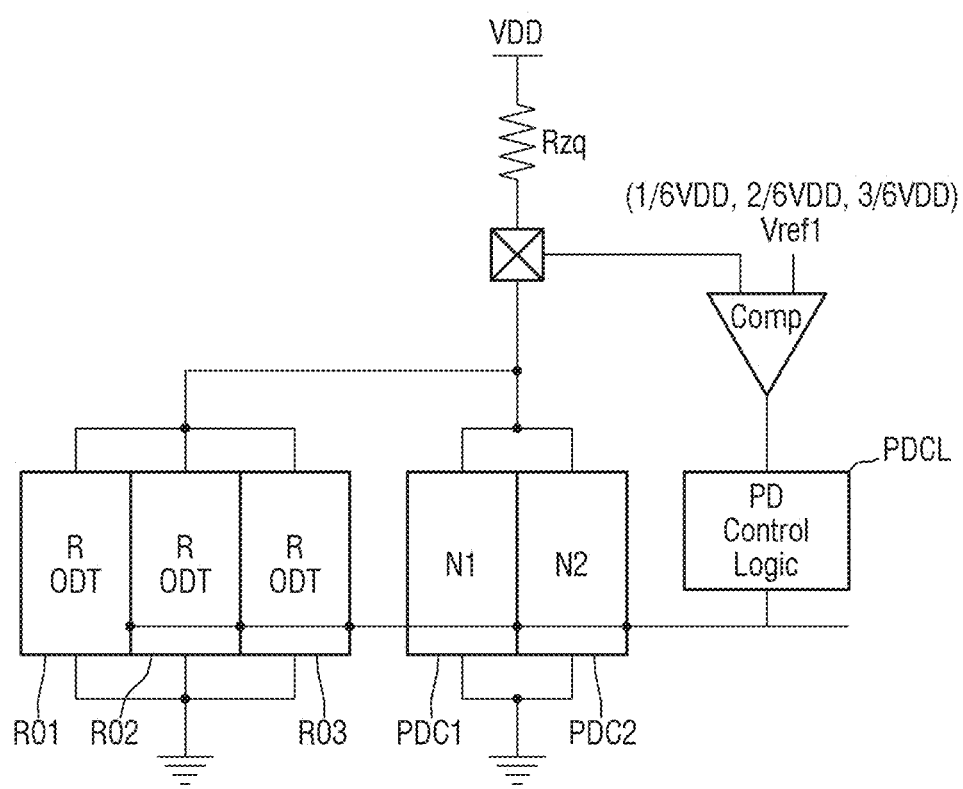
FIGS. 14 and 15 are diagrams illustrating the method of FIG. 13.

For example, referring to FIG. 14, while setting the resistance value of a ZQ resistor Rzq replacing the pull-up circuit to 120Ω, and adjusting the resistance values of ODT circuits RO1, RO2, and RO3 and the resistance values of the pull-down circuits PDC1 and PDC2 through a pull-down control logic PDCL, voltages of ⅙*Vdd and ⅖*Vdd are sequentially applied (two loops) as a comparison voltage Vref1 to determine the pull-down ZQ code NECODE1 for the pull-down circuit PDC1, and the pull-down ZQ code NECODE2 for the pull-down circuit PDC2. According to embodiments, each of the ODT circuits RO1, RO2 and RO3 may be implemented using a variable resistor.

According to embodiments, the first loop may involve iteratively adjusting (e.g., by the pull-down control logic PDCL) the resistance values of ODT circuits RO1, RO2, and RO3 and the resistance value of the pull-down circuits PDC1 (e.g., by adjusting the number of pull-down units enabled in the pull-down circuit PDC1, the pull-down circuit PDC2 may be disconnected) in each of until the voltage at an output node is determined to be equal (or similar) to the comparison voltage (e.g., ⅙*Vdd). For example, the comparison voltage and the voltage at the output node may both be input to a comparator Comp, and the pull-down control logic PDCL may determine whether the voltage at the output node is equal (or similar) to the comparison voltage based on an output signal from the comparator Comp. The pull-down ZQ code NECODE1 may be set (e.g., by the pull-down control logic PDCL) to a value corresponding to the specific number of pull-down units enabled in the pull-down circuit PDC1 at the time the voltage at the output node is determined to be equal (or similar) to the comparison voltage such that, when the pull-down circuit PDC1 receives the pull-down ZQ code NECODE1 the specific number of pull-down units are enabled.

According to embodiments, the second loop may involve iteratively adjusting (e.g., by the pull-down control logic PDCL) the resistance values of ODT circuits RO1, RO2, and RO3 and the resistance value of the pull-down circuit PDC2 (e.g., by adjusting the number of pull-down units enabled in the pull-down circuit PDC2, the specific number of pull-down units may be enabled in the pull-down circuit PDC1) in each of until the voltage at an output node is determined to be equal (or similar) to the comparison voltage (e.g., ⅔*Vdd).

Then, by applying a voltage of ⅜*Vdd (one loop) as the comparison voltage Vref1, the pull-down ZQ code NECODE3 for the pull-down circuit PDC3 may be determined. Through this process, the pull-down ZQ codes NECODE1, NECODE2, and NECODE3 in which voltage variation and temperature variation in the packaging operation are reflected may be determined.

Next, referring to FIGS. 1 and 13, it is checked whether the pull-up circuits PUC1, PUC2, and PUC3 are linear (operation S240). That is, it is checked whether the TMRS value is 0 or 2.

If the pull-up circuits PUC1, PUC2, and PUC3 are linear (Y in operation S240), the pull-up circuits PUC1, PUC2, and PUC3 share the initial pull-up ZQ code IPE (see FIG. 10) that is previously set (operation S250). That is, all of the pull-up ZQ codes PECODE1, PECODE2, and PECODE3 are set to the initial pull-up ZQ code IPE (see FIG. 10). Accordingly, setting of the pull-up ZQ codes PECODE1, PECODE2, and PECODE3 may be completed in one loop.

If the pull-up circuits PUC1, PUC2, and PUC3 are non-linear (N in operation S240), the pull-up ZQ codes PECODE1, PECODE2, and PECODE3 are determined for the pull-up circuits PUC1, PUC2, and PUC3, respectively (operation S260).

Figure 15:
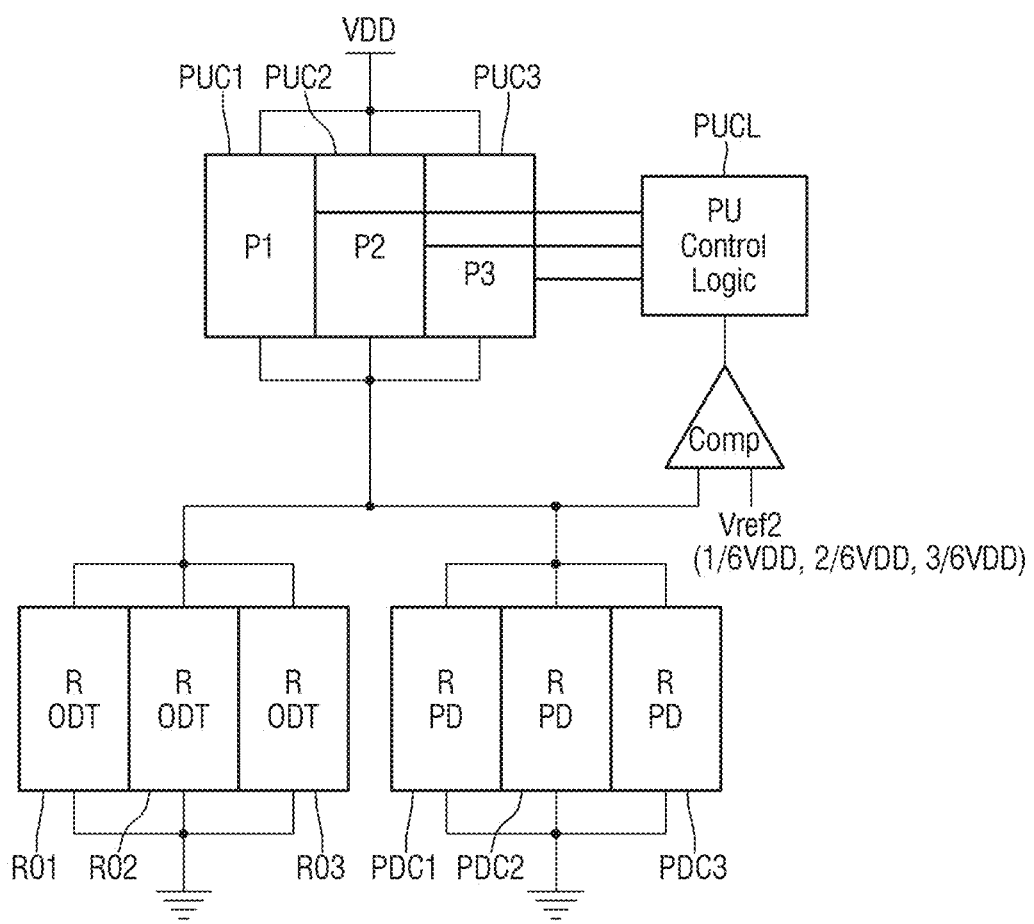

For example, referring to FIG. 15, while fixing the resistance values of the ODT circuits RO1, RO2, and RO3 and the resistance values of the pull-down circuits PDC1, PDC2, and PDC3, and adjusting the resistance values of the pull-up circuits PUC1, PUC2, and PUC3 through a pull-up control logic PUCL, voltages of ⅛*Vdd, ⅖*Vdd, and ⅜*Vdd may be sequentially applied (three loops) as a comparison voltage Vref2 to determine the pull-up ZQ code PECODE1 for the pull-up circuit PUC1, the pull-up ZQ code PECODE2 for the pull-up circuit PUC2, and the pull-up ZQ code PECODE3 for the pull-up circuit PUC3. Through this process, the pull-up ZQ codes PECODE1, PECODE2, and PECODE3 in which voltage variation and temperature variation in the packaging operation are reflected may be determined.

It is illustrated in FIG. 13 that the pull-down ZQ codes NECODE1, NECODE2, and NECODE3 are first determined and then the pull-up ZQ codes PECODE1, PECODE2, and PECODE3 are determined, but in embodiments, the operation of determining the pull-down ZQ codes NECODE1, NECODE2, and NECODE3 and the operation of determining the pull-up ZQ codes PECODE1, PECODE2, and PECODE3 may be overlappingly performed.

Next, a case in which the TMRS value is 3 (Y in operation S200) will be described.

As described above, when the TMRS value is 3, a total of six loops are performed. In embodiments, in this case, the initial pull-down ZQ code INE (see FIG. 10) and the initial pull-up ZQ code IPE (see FIG. 10) are used to shorten the ZQ calibration execution time.

Specifically, by using the initial pull-down ZQ code INE (see FIG. 10), the pull-down ZQ codes NECODE1, NECODE2, and NECODE3 are determined for the pull-down circuits PDC1, PDC2, and PDC3, respectively (operation S270).

The implementation of this operation is similar to that of the above-described operation S230. The difference is that in operation S230, when the number of bits of the pull-down ZQ code is 5 bits, in order to find the value of each of the pull-down ZQ codes NECODE1, NECODE2, and NECODE3, a value of 00000 or 11111 is selected as a starting value to execute the search, while in operation S270, in order to find the value of each of the pull-down ZQ codes NECODE1, NECODE2, and NECODE3, the initial pull-down ZQ code INE (see FIG. 10) is selected to execute the search. Accordingly, the ZQ calibration time may be shortened.

Next, by using the initial pull-up ZQ code IPE (see FIG. 10), the pull-up ZQ codes PECODE1, PECODE2, and PECODE3 are determined for the pull-up circuits PUC1, PUC2, and PUC3, respectively (operation S280).

The implementation of this operation is similar to that of the above-described operation S260. The difference is that in operation S260, when the number of bits of the pull-up ZQ code is 5 bits, in order to find the value of each of the pull-up ZQ codes PECODE1, PECODE2, and PECODE3, a value of 00000 or 11111 is selected as a starting value to execute the search, while in operation S280, in order to find the value of each of the pull-up ZQ codes PECODE1, PECODE2, and PECODE3, the initial pull-up ZQ code IPE (see FIG. 10) is selected to execute the search. Accordingly, the ZQ calibration time may also be shortened.

As such, in embodiments, the ZQ calibration setting indicator is set based on the linearity in the wafer level operation, and the pull-up ZQ codes and the pull-down ZQ codes are determined and set in the packaging operation using the ZQ calibration setting indicator set in the wafer level operation, so that the ZQ calibration time may be shortened compared to a case where there is no such ZQ calibration setting indicator. Further, even in a case where many loops are performed to determine the pull-up ZQ codes and the pull-down ZQ codes, the ZQ calibration time may be shortened by performing ZQ calibration using the initial pull-up ZQ code and the initial pull-down ZQ code used for linearity determination in the wafer level operation. According to embodiments, after the ZQ calibration is completed, the transmission driver TX may, under the control of the memory controller MCON, generate a communication signal and transmit the communication signal to the reception driver RX via the channel. For example, the communication signal may be a pulse amplitude modulation (PAM)-N(N being a natural number greater than or equal to 3) signal.

Figure 16A:
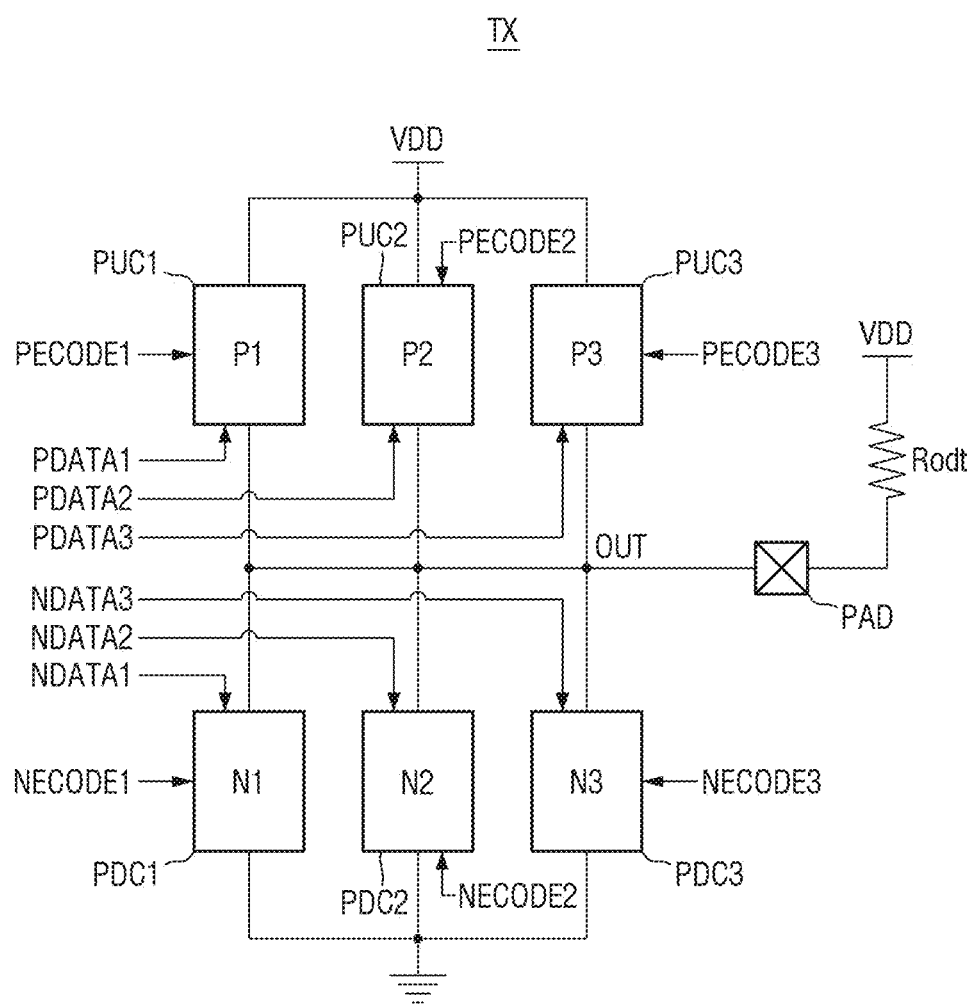
FIG. 16A is a diagram illustrating a transmission driver according to embodiments.

FIG. 16A is a diagram illustrating a transmission driver according to embodiments.

Figures 16B, 16C:
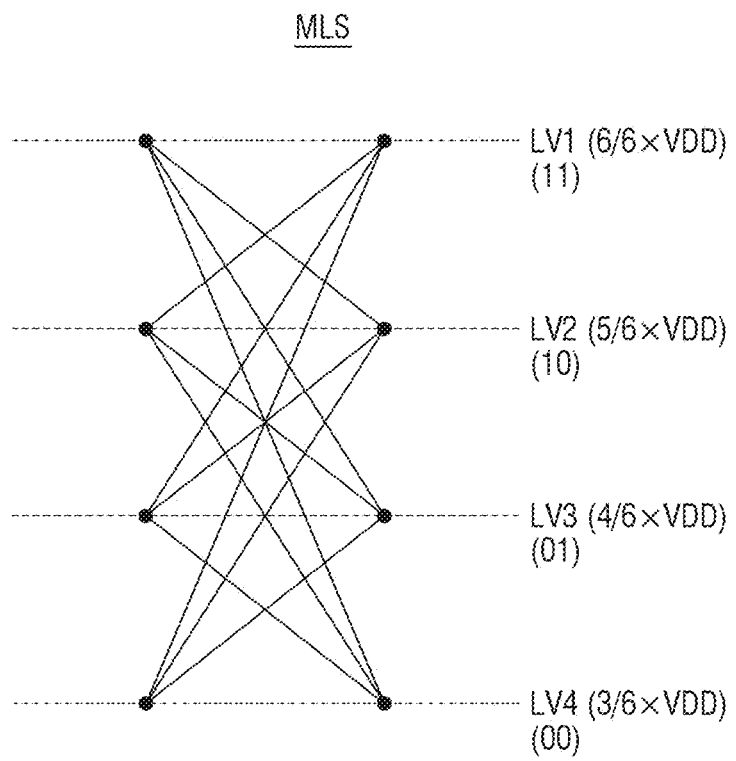
FIGS. 16B and 16C are diagrams explaining the operation of FIG. 16A.

FIGS. 16B and 16C are diagrams explaining the operation of FIG. 16A.

In the following description, redundant description of the above-described examples may be omitted while focusing on differences.

Referring to FIG. 16A, the transmission driver TX according to embodiments may include the ODT resistor Rodt of a power voltage termination (VDD termination) method.

In this case, as illustrated in FIGS. 16B to 16C, when the data outputted from the transmission driver TX is 11, the pull-up data signals PDATA1 to PDATA3 enabling all of the pull-up circuits PUC1, PUC2, and PUC3 and the pull-down data signals NDATA1 to NDATA3 disabling all of the pull-down circuits PDC1, PDC2 and PDC3 are generated.

Accordingly, all of the pull-up circuits PUC1, PUC2, and PUC3 are enabled, and all of the pull-down circuits PDC1, PDC2, and PDC3 are disabled, so that the multi-level signal MLS may have a signal level of Vdd.

Next, when the data outputted from the transmission driver TX is 10, the pull-up data signals PDATA1 to PDATA3 and the pull-down data signals NDATA1 to NDATA3 that enable the pull-up circuits PUC2 and PUC3 and the pull-down circuit PDC3 and disable the pull-up circuit PUC1 and the pull-down circuits PDC1 and PDC2 are generated.

Accordingly, the pull-up circuits PUC2 and PUC3 and the pull-down circuit PDC3 are enabled, and the pull-up circuit PUC1 and the pull-down circuits PDC1 and PDC2 are disabled, so that the multi-level signal MLS may have a signal level of ⅝*Vdd.

Next, when the data outputted from the transmission driver TX is 01, the pull-up data signals PDATA1 to PDATA3 and the pull-down data signals NDATA1 to NDATA3 that enable the pull-up circuit PUC3 and the pull-down circuits PDC2 and PDC3 and disable the pull-up circuits PUC1 and PUC2 and the pull-down circuit PDC1 are generated.

Accordingly, the pull-up circuit PUC3 and the pull-down circuits PDC2 and PDC3 are enabled, and the pull-up circuits PUC1 and PUC2 and the pull-down circuit PDC1 are disabled, so that the multi-level signal MLS may have a signal level of ⅜*Vdd.

Next, when data outputted from the transmission driver TX is 00, the pull-up data signals PDATA1 to PDATA3 and the pull-down data signals NDATA1 to NDATA3 that disable all of the pull-up circuits PUC1, PUC2, and PUC3 and enable all of the pull-down circuits PDC1, PDC2 and PDC3 are generated.

Accordingly, all of the pull-up circuits PUC1, PUC2, and PUC3 are disabled, and all of the pull-down circuits PDC1, PDC2, and PDC3 are enabled, so that the multi-level signal MLS may have a signal level of ⅜*Vdd.

Those of ordinary skill in the art will be able to understand the operation of these pull-up circuits and pull-down circuits, and thus, redundant detailed descriptions will be omitted.

Figure 17:
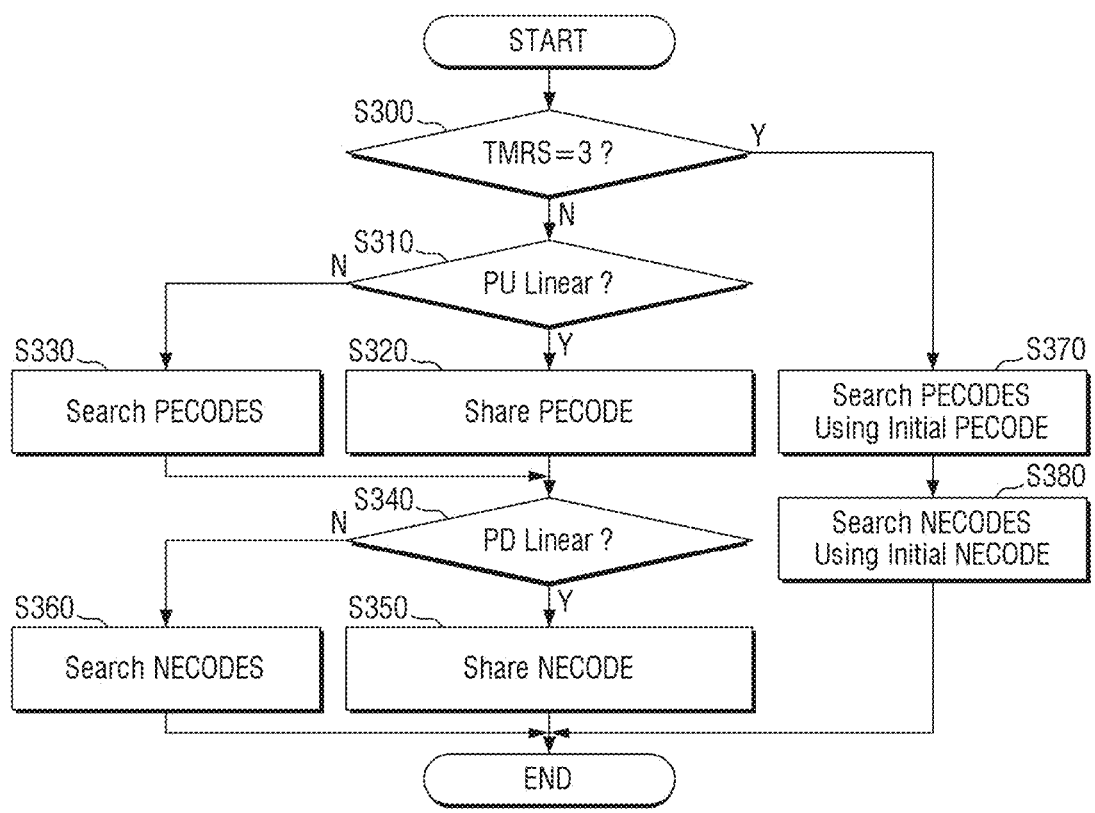
FIG. 17 is a flowchart illustrating a method of setting a ZQ calibration code at a packaging level for the transmission driver of FIG. 16A.
Figure 18:
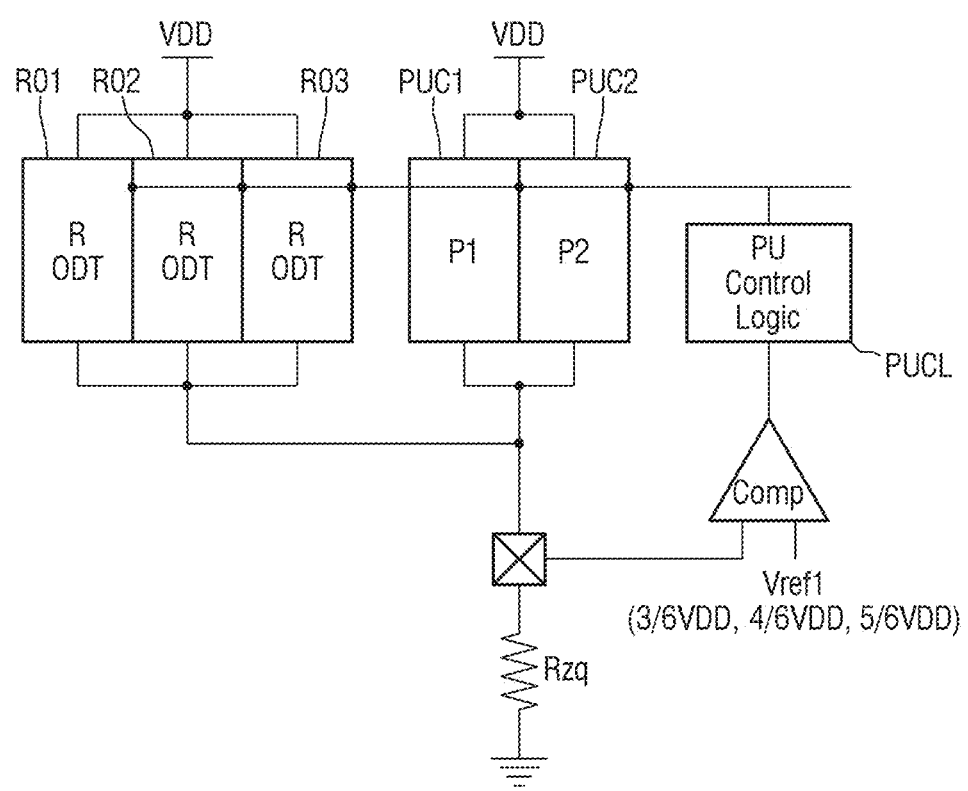
FIGS. 18 and 19 are diagrams illustrating the method of FIG. 17.
Figure 19:
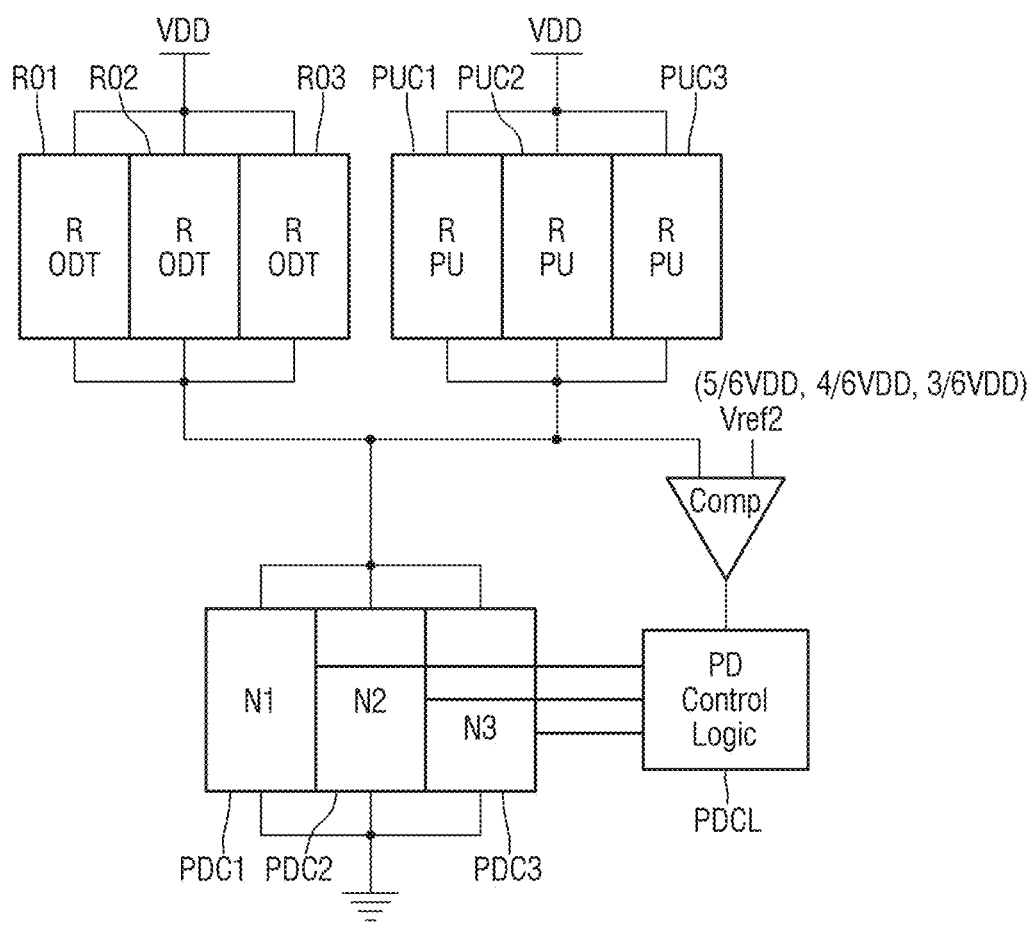

FIG. 17 is a flowchart illustrating a method of setting a ZQ calibration code at a packaging level for the transmission driver of FIG. 16A. FIGS. 18 and 19 are diagrams illustrating the method of FIG. 17.

Referring to FIGS. 16A, 16B, 16C and 17, it is checked whether the TMRS value, which is the ZQ calibration setting indicator, is 3 (operation S300). That is, it is checked whether the pull-up circuits PUC1, PUC2, and PUC3 and the pull-down circuits PDC1, PDC2, and PDC3 are all non-linear.

First, a case in which the TMRS value is not 3 (N in operation S300) will be described.

It is checked whether the pull-up circuits PUC1, PUC2, and PUC3 are linear (operation S310). That is, it is checked whether the TMRS value is 0 or 2.

If the pull-up circuits PUC1, PUC2, and PUC3 are linear (Y in operation S310), the pull-up circuits PUC1, PUC2, and PUC3 share the initial pull-up ZQ code IPE (see FIG. 10) that is previously set (operation S320). That is, all of the pull-up ZQ codes PECODE1, PECODE2, and PECODE3 are set to the initial pull-up ZQ code IPE (see FIG. 10). Accordingly, setting of the pull-up ZQ codes PECODE1, PECODE2, and PECODE3 may be completed in one loop.

If the pull-up circuits PUC1, PUC2, and PUC3 are non-linear (N in operation S310), the pull-up ZQ codes PECODE1, PECODE2, and PECODE3 are determined for the pull-up circuits PUC1, PUC2, and PUC3, respectively (operation S330).

For example, referring to FIG. 18, while setting the resistance value of a ZQ resistor Rzq replacing the pull-down circuit to 120Ω, and adjusting the resistance values of the ODT circuits RO1, RO2, and RO3 and the resistance values of the pull-up circuits PUC1 and PUC2 through the pull-up control logic PUCL, voltages of ⅜*Vdd and ⅘*Vdd are sequentially applied (two loops) as the comparison voltage Vref1 to determine the pull-up ZQ code PECODE1 for the pull-up circuit PUC1, and the pull-up ZQ code PECODE2 for the pull-up circuit PUC2.

Then, by applying a voltage of ⅝*Vdd (one loop) as the comparison voltage Vref1, the pull-up ZQ code PECODE3 for the pull-up circuit PUC3 may be determined. Through this process, the pull-up ZQ codes PECODE1, PECODE2, and PECODE3 in which voltage variation and temperature variation in the packaging operation are reflected may be determined.

Next, referring to FIG. 17, it is checked whether the pull-down circuits PDC1, PDC2, and PDC3 are linear (operation S340). That is, it is checked whether the TMRS value is 0 or 1.

If the pull-down circuits PDC1, PDC2, and PDC3 are linear (Y in operation S340), the pull-down circuits PDC1, PDC2, and PDC3 share the initial pull-down ZQ code INE (see FIG. 10) that is previously set (operation S350). That is, all of the pull-down ZQ codes NECODE1, NECODE2, and NECODE3 are set to the initial pull-down ZQ code INE (see FIG. 10). Accordingly, setting of the pull-down ZQ codes NECODE1, NECODE2, and NECODE3 may be completed in one loop.

If the pull-down circuits PDC1, PDC2, and PDC3 are non-linear (N in operation S340), the pull-down ZQ codes NECODE1, NECODE2, and NECODE3 are determined for the pull-down circuits PDC1, PDC2, and PDC3, respectively (operation S360).

For example, referring to FIG. 19, while fixing the resistance values of the ODT circuits RO1, RO2, and RO3 and the resistance values of the pull-up circuits PUC1, PUC2, and PUC3, and adjusting the resistance values of the pull-down circuits PDC1, PDC2, and PDC3 through the pull-down control logic PDCL, voltages of ⅝*Vdd, ⅘*Vdd, and ⅜*Vdd may be sequentially applied (three loops) as the comparison voltage Vref2 to determine the pull-down ZQ code NECODE1 for the pull-down circuit PDC1, the pull-down ZQ code NECODE2 for the pull-down circuit PDC2, and the pull-down ZQ code NECODE3 for the pull-down circuit PDC3. Through this process, the pull-down ZQ codes NECODE1, NECODE2, and NECODE3 in which voltage variation and temperature variation in the packaging operation are reflected may be determined.

Next, a case in which the TMRS value is 3 (Y in operation S300) will be described.

As described above, when the TMRS value is 3, a total of 6 loops are performed. In embodiments, in this case, the initial pull-up ZQ code IPE (see FIG. 10) and the initial pull-down ZQ code INE (see FIG. 10) are used to shorten the ZQ calibration execution time.

Specifically, by using the initial pull-up ZQ code IPE (see FIG. 10), the pull-up ZQ codes PECODE1, PECODE2, and PECODE3 are determined for the pull-up circuits PUC1, PUC2, and PUC3, respectively (operation S370).

The implementation of this operation is similar to that of the above-described operation S330. The difference is that, in operation S330, when the number of bits of the pull-up ZQ code is 5 bits, in order to find the value of each of the pull-up ZQ codes PECODE1, PECODE2, and PECODE3, a value of 00000 or 11111 is selected as a starting value to execute the search, while in operation S370, in order to find the value of each of the pull-up ZQ codes PECODE1, PECODE2, and PECODE3, the initial pull-up ZQ code IPE (see FIG. 10) is selected to execute the search. Accordingly, the ZQ calibration time may be shortened.

Next, by using the initial pull-up ZQ code INE (see FIG. 10), the pull-down ZQ codes NECODE1, NECODE2, and NECODE3 are determined for the pull-down circuits PDC1, PDC2, and PDC3, respectively (operation S380).

The implementation of this operation is similar to that of the above-described operation S360. The difference is that in operation S360, when the number of bits of the pull-down ZQ code is 5 bits, in order to find the value of each of the pull-down ZQ codes NECODE1, NECODE2, and NECODE3, a value of 00000 or 11111 is selected as a starting value to execute the search, while in operation S380, in order to find the value of each of the pull-down ZQ codes NECODE1, NECODE2, and NECODE3, the initial pull-down ZQ code INE (see FIG. 10) is selected to execute the search. Accordingly, the ZQ calibration time may be shortened.

Figure 20:
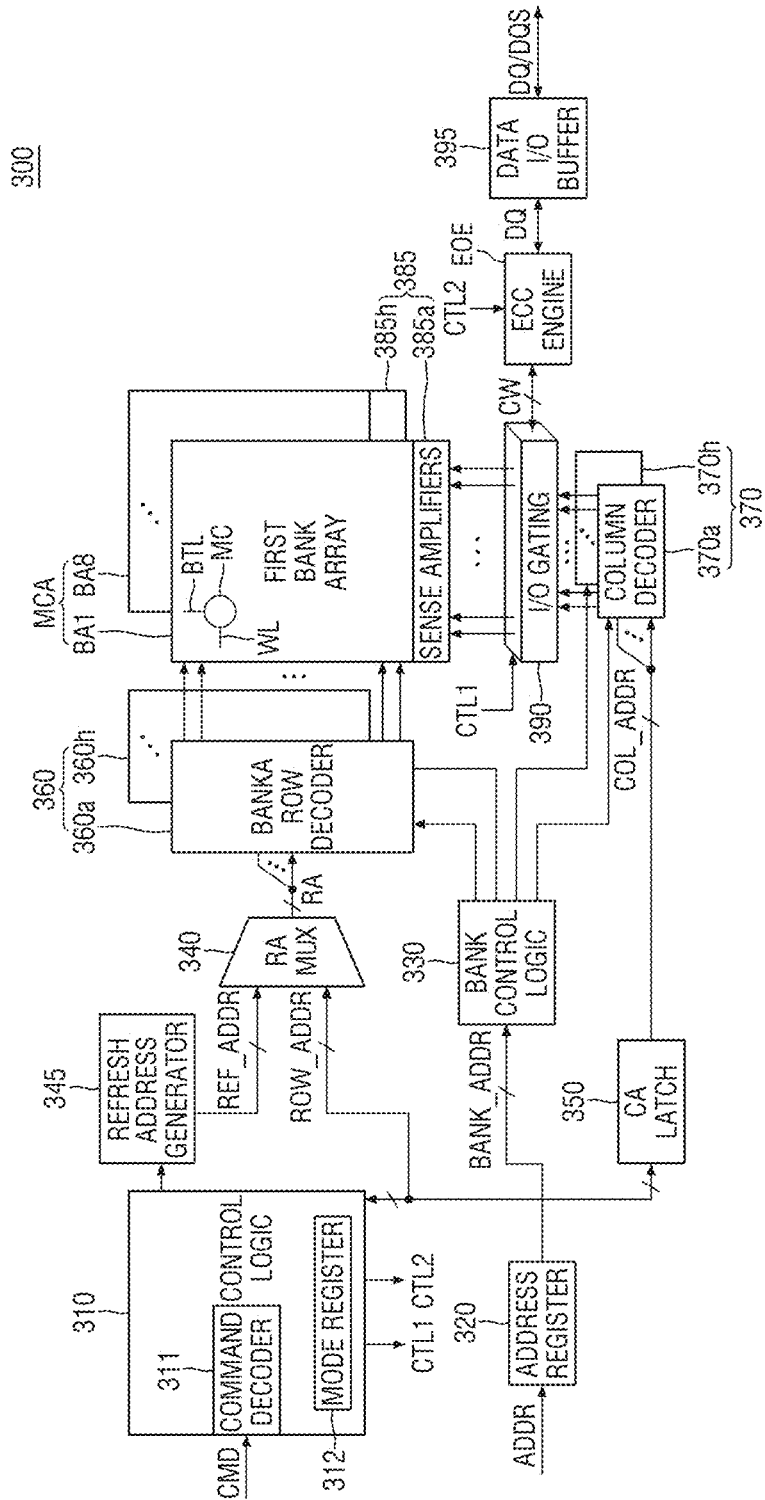
FIG. 20 is a diagram illustrating a memory device according to embodiments.

FIG. 20 is a diagram illustrating a memory device according to embodiments.

FIG. 20 is a diagram illustrating a case in which the aforementioned memory device 100 (see FIG. 1) is a DRAM.

Referring to FIG. 20, a memory device 300 may include a control logic 310, an address register 320, a bank control logic 330, a row address multiplexer 340, a refresh address generator 345, a column address latch 350, a row decoder 360, a column decoder 370, a sense amplifier unit 385, an input/output gating circuit 390, a memory cell array MCA, an error correction code (ECC) engine ECE, and/or a data input/output buffer 395.

The memory cell array MCA may include a plurality of memory cells MC for storing data. For example, the memory cell array MCA may include first to eighth bank arrays BA1 to BA8. Each of the first to eighth bank arrays BA1 to BA8 may include a plurality of word lines WL, a plurality of bit lines BTL, and the plurality of memory cells MC disposed at the intersections of the word lines WL and the bit lines BTL that cross each other.

The memory cell array MCA may include the first to eighth bank arrays BA1 to BA8. FIG. 20 illustrates the memory device 300 including the eight bank arrays BA1 to BA8, but embodiments are not limited thereto, and the memory device 300 may include an arbitrary number of bank arrays.

The control logic 310 may control the operation of the memory device 300. For example, the control logic 310 may generate control signals CTL1 and CTL2 so that the memory device 300 performs an operation for writing data or an operation for reading data. The control logic 310 may include a command decoder 311 for decoding a command CMD received from an external host device, and a mode register 312 for setting an operation mode of the memory device 300.

For example, the command decoder 311 may generate control signals corresponding to the command CMD by decoding a write enable signal, a row address strobe signal, a column address strobe signal, a chip select signal, and the like. The control logic 310 may receive a clock signal and a clock enable signal for driving the memory device 300 in a synchronous manner.

In addition, the control logic 310 may control the refresh address generator 345 to generate a refresh row address REF_ADDR in response to the refresh command.

The address register 320 may receive an address ADDR from an external host device. For example, the address register 320 may receive the address ADDR including a bank address BANK_ADDR, a row address ROW_ADDR, and a column address COL_ADDR. The address register 320 may provide the received bank address BANK_ADDR to the bank control logic 330, may provide the received row address ROW_ADDR to the row address multiplexer 340, and may provide the received column address COL_ADDR to the column address latch 350.

The bank control logic 330 may generate bank control signals in response to the bank address BANK_ADDR received from the address register 320. In response to these bank control signals, a bank row decoder corresponding to a bank address BANK_ADDR among first to eighth bank row decoders 360a to 360h may be activated, and a bank column decoder corresponding to the bank address BANK_ADDR among first to eighth bank column decoders 370a to 370h may be activated.

The row address multiplexer 340 may receive the row address ROW_ADDR from the address register 320 and may receive the refresh row address REF_ADDR from the refresh address generator 345. The row address multiplexer 340 may selectively output the row address ROW_ADDR received from the address register 320 or the refresh row address REF_ADDR received from the refresh address generator 345 as a row address RA. The row address RA outputted from the row address multiplexer 340 may be applied to each of the first to eighth bank row decoders 360a to 360h.

The refresh address generator 345 may generate the refresh row address REF_ADDR for refreshing memory cells. The refresh address generator 345 may provide the refresh row address REF_ADDR to the row address multiplexer 340. Accordingly, memory cells disposed on the word line corresponding to the refresh row address REF_ADDR may be refreshed.

The column address latch 350 may receive the column address COL_ADDR from the address register 320 and temporarily store the received column address COL_ADDR. In addition, the column address latch 350 may gradually increase the received column address COL_ADDR in a burst mode. The column address latch 350 may apply the temporarily stored or gradually increased column address COL_ADDR to each of the first to eighth bank column decoders 370a to 370h.

The row decoder 360 may include the first to eighth bank row decoders 360a to 360h respectively connected to the first to eighth bank arrays BA1 to BA8. The column decoder 370 may include the first to eighth bank column decoders 370a to 370h respectively connected to the first to eighth bank arrays BA1 to BA8. The sense amplifier unit 385 may include first to eighth bank sense amplifiers 385a to 385h respectively connected to the first to eighth bank arrays BA1 to BA8.

The bank row decoder activated by the bank control logic 330 among the first to eighth bank row decoders 360a to 360h may decode the row address RA outputted from the row address multiplexer 340 to activate the word line corresponding to the row address RA. For example, the activated bank row decoder may apply a word line driving voltage to a word line corresponding to the row address RA.

The bank column decoder activated by the bank control logic 330 among the first to eighth bank column decoders 370a to 370h may activate the bank sense amplifiers 385a to 385h corresponding to the bank address BANK_ADDR and the column address COL_ADDR through the input/output gating circuit 390.

The input/output gating circuit 390 may include, together with circuits for gating input/output data, an input data mask logic, read data latches for storing data outputted from the first to eighth bank arrays BA1 to BA8, and write drivers for writing data to the first to eighth bank arrays BA1 to BA8.

A codeword CW to be read in one bank array among the first to eighth bank arrays BA1 to BA8 may be sensed by the bank sense amplifiers 385a to 385h corresponding to one bank array, and may be stored in read data latches.

The ECC engine ECE may perform ECC decoding on the codeword CW stored in the read data latches. When an error is detected in the data of the codeword CW, the ECC engine ECE may provide a corrected data signal DQ to an external memory controller through the data input/output buffer 395.

The data signal DQ to be written to one bank array among the first to eighth bank arrays BA1 to BA8 may be provided to the ECC engine ECE, and the ECC engine ECE may generate parity bits based on the data signal DQ and provide the data signal DQ and the parity bits to the input/output gating circuit 390. The input/output gating circuit 390 may write the data signal DQ and the parity bits to a subpage of one bank array through write drivers.

The data input/output buffer 395 may be provided with the data signal DQ and a data strobe signal DQS from the outside (e.g., the host) or transmit the data signal DQ and the data strobe signal DQS to the outside.

In embodiments, the data input/output buffer 395 may include a first data input/output buffer (e.g., a data buffer) that is provided with or transmits the data signal DQ and a second data input/output buffer (e.g., a data strobe buffer) that is provided with or transmits the data strobe signal DQS.

The data input/output buffer 395, in a write operation, may buffer or drive the data signal DQ (e.g., write data) to provide the data signal DQ to the ECC engine ECE, and in a read operation, may buffer or drive the data signal DQ (e.g., read data) provided from the ECC engine ECE to provide the data signal DQ to an external host device.

In embodiments, the above-described transmission driver TX of FIG. 1 may be included in, for example, the data input/output buffer 395. In addition, the control logic 310 may perform the operation of the above-described memory controller MCON in FIG. 1.

Figure 21:
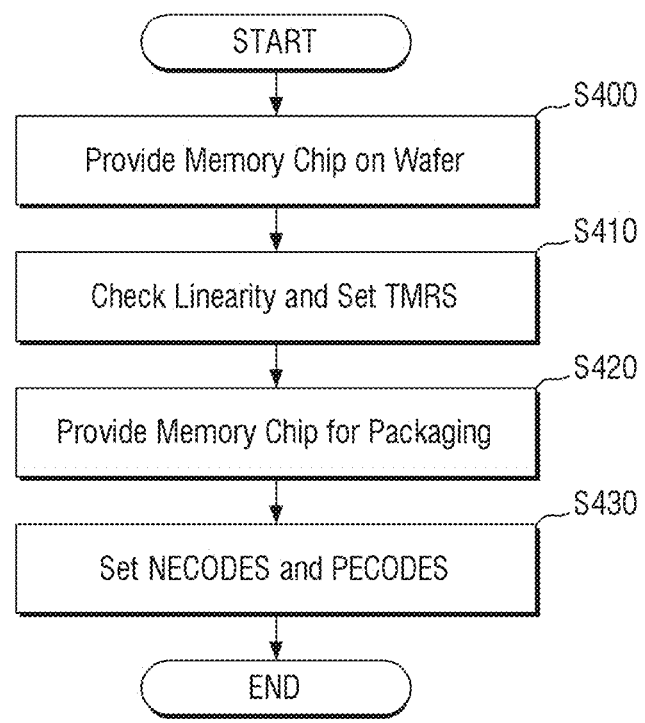
FIG. 21 is a flowchart illustrating a method for fabricating a memory device according to embodiments.

FIG. 21 is a flowchart illustrating a method for fabricating a memory device according to embodiments.

Referring to FIG. 21, a memory chip fabricated according to a predetermined or alternatively, given process is provided on a wafer (operation S400).

Here, the memory chip may be the aforementioned memory device 100 (see FIG. 1) or a partial component included in the memory device 100 (see FIG. 1). According to embodiments, the partial component may be the transmission driver Tx.

Next, the linearity of the pull-up circuits and the pull-down circuits of the memory chip is checked, and the TMRS is set based on the measurement result (operation S410).

For example, through the process described above with reference to FIGS. 9 to 12, the linearity of the pull-up circuits and the pull-down circuits of the memory chip may be checked, and the TMRS may be set based on the measurement result.

Next, a memory chip for packaging is provided (operation S420).

That is, a packaging process of the memory chip is prepared.

Next, a ZQ calibration code is set (operation S430).

For example, through the process described above with reference to FIGS. 13 to 15 or FIGS. 17 to 19, the pull-down ZQ codes NECODE1, NECODE2, and NECODE3 and the pull-up ZQ codes PECODE1, PECODE2, and PECODE3 may be set for the pull-up circuits and the pull-down circuits of the memory chip.

Conventional devices for calibrating a memory device determine pull-up ZQ codes and pull-down ZQ codes in a packaging operation. For example, the conventional devices perform a separate search loop to determine a respective pull-up ZQ code for each pull-up circuit in the memory device, and perform a separate search loop to determine a respective pull-down ZQ code for each pull-down circuit in the memory device. For a memory device including a thermometer type transmission driver which includes three pull-up circuits controlled by three independent pull-up ZQ codes and three pull-down circuits controlled by three independent pull-down ZQ codes, for instance, six separate search loops are used to determine the pull-up ZQ codes and the pull-down ZQ codes, resulting in excessive delay in performing ZQ calibration and corresponding resource wastage (e.g., power, processor, etc.).

However, according to embodiments, improved devices for calibrating a memory device are provided. For example, during a wafer level operation (before the packaging operation), an initial pull-up ZQ code and an initial ZQ pull-down code are determined (e.g., taking into account a process variation) and a determination is made as to the linearity of signals generated by pull-up circuits and pull-down circuits when the initial pull-up ZQ code and the initial ZQ pull-down code are applied. Based on the linearity of the signals, a determination is made as to a number of search loops to perform in the packaging operation to determine the pull-up ZQ codes and the pull-down ZQ codes. Accordingly, in cases in which the determined number of search loops is less than the number of pull-up circuits and pull-down circuits (e.g., six in an implementation with three pull-up circuits and three pull-down circuits), the improved devices reduce the delay in performing ZQ calibration in comparison to the conventional devices. Also, in cases in which the determined number of search loops is equal (or similar) to the number of pull-up circuits and pull-down circuits (e.g., six in an implementation with three pull-up circuits and three pull-down circuits), the improved devices perform the ZQ calibration using the initial pull-up ZQ code and the initial ZQ pull-down code, thereby reducing the delay in performing ZQ calibration. Therefore, the improved devices overcome the deficiencies of the conventional devices to at least reduce delay in performing ZQ calibration and corresponding resource wastage (e.g., power, processor, etc.) as compared to the conventional devices.

According to embodiments, operations described herein as being performed by the memory device 100, the host device 200, the memory controller MCON, the transmission driver TX, the ZQ calibration setting indicator ZQS, the reception driver RX, the host controller HCON, the pull-down control logic PDCL, the ODT circuits RO1, RO2, and RO3, the comparator Comp, the pull-up control logic PUCL, the memory device 300, the control logic 310, the bank control logic 330, the row address multiplexer 340, the refresh address generator 345, the column address latch 350, the row decoder 360, the column decoder 370, the sense amplifier unit 385, the input/output gating circuit 390 and/or the ECC engine ECE may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The various operations of methods described above may be performed by any suitable device capable of performing the operations, such as the processing circuitry discussed above. For example, as discussed above, the operations of methods described above may be performed by various hardware and/or software implemented in some form of hardware (e.g., processor, ASIC, etc.).

The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or operations of a method or algorithm and functions described in connection with embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium (e.g., the DRAM of the memory device 100). A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

Embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail herein. Although discussed in a particular manner, a function or operation specified in a specific block may be performed differently from the flow specified in a flowchart, flow diagram, etc. For example, functions or operations illustrated as being performed serially in two consecutive blocks may actually be performed concurrently, simultaneously, contemporaneously, or in some cases be performed in reverse order.

In concluding the detailed description, those skilled in the art will appreciate that many variations and modifications may be made to embodiments without substantially departing from the principles of the present disclosure. Therefore, the disclosed examples of the inventive concepts are used in a generic and descriptive sense only and not for purposes of limitation.

What is claimed is:

1. A method for calibrating a memory device, comprising:
measuring a linearity of a first pull-up circuit, a second pull-up circuit, a third pull-up circuit, a first pull-down circuit, a second pull-down circuit and a third pull-down circuit using an initial pull-up code and an initial pull-down code to obtain a measurement result, each of the first pull-up circuit, the second pull-up circuit and the third pull-up circuit having a respective resistance value determined based on a respective pull-up code, and each of the first pull-down circuit, the second pull-down circuit and the third pull-down circuit having a respective resistance value determined based on a respective pull-down code; and
determining a calibration setting indicator based on the measurement result, the calibration setting indicator indicating a calibration method of a transmission driver including the first pull-up circuit, the second pull-up circuit, the third pull-up circuit, the first pull-down circuit, the second pull-down circuit and the third pull-down circuit.

2. The method of claim 1, wherein the measuring the linearity comprises:
measuring a plurality of resistance values of the first pull-up circuit, the second pull-up circuit, the third pull-up circuit, the first pull-down circuit, the second pull-down circuit and the third pull-down circuit while applying a plurality of voltage levels to the transmission driver.

3. The method of claim 2, wherein
the plurality of resistance values includes a first resistance value of the first pull-up circuit measured while applying the plurality of voltage levels to the transmission driver; and
the measuring the linearity comprises:
determining that the first pull-up circuit is linear in response to the first resistance value being within an error range; and
determining that the first pull-up circuit is non-linear in response to the first resistance value being outside of the error range.

4. The method of claim 1, wherein the determining the calibration setting indicator comprises determining a test mode register set (TMRS) value.

5. The method of claim 4, further comprising:
performing fusing based on the TMRS value.

6. The method of claim 1, wherein the calibration method is a ZQ calibration method.

7. The method of claim 1, further comprising:
determining the respective pull-up code of each of the first pull-up circuit, the second pull-up circuit and the third pull-up circuit based on the calibration setting indicator; and
determining the respective pull-down code of each of the first pull-down circuit, the second pull-down circuit and the third pull-down circuit based on the calibration setting indicator.

8. The method of claim 7, wherein
the determining the respective pull-up code includes determining the respective pull-up code of each of the first pull-up circuit, the second pull-up circuit and the third pull-up circuit to be set to the initial pull-up code in response to the calibration setting indicator having a first value; and
the determining the respective pull-down code includes determining the respective pull-down code of each of the first pull-down circuit, the second pull-down circuit and the third pull-down circuit to be set to the initial pull-down code in response to the calibration setting indicator having the first value.

9. The method of claim 8, wherein
the determining the respective pull-up code includes determining the respective pull-up code of each of the first pull-up circuit, the second pull-up circuit and the third pull-up circuit by executing a plurality of first search loops in response to the calibration setting indicator having a second value; and
the determining the respective pull-down code includes determining the respective pull-down code of each of the first pull-down circuit, the second pull-down circuit and the third pull-down circuit to be set to the initial pull-down code in response to the calibration setting indicator having the second value.

10. The method of claim 9, wherein
the determining the respective pull-up code includes determining the respective pull-up code of each of the first pull-up circuit, the second pull-up circuit and the third pull-up circuit to be set to the initial pull-up code in response to the calibration setting indicator having a third value; and
the determining the respective pull-down code includes determining the respective pull-down code of each of the first pull-down circuit, the second pull-down circuit and the third pull-down circuit by executing a plurality of second search loops in response to the calibration setting indicator having the third value.

11. The method of claim 10, wherein
the determining the respective pull-up code includes determining the respective pull-up code of each of the first pull-up circuit, the second pull-up circuit and the third pull-up circuit by executing the plurality of first search loops in response to the calibration setting indicator having a fourth value; and
the determining the respective pull-down code includes determining the respective pull-down code of each of the first pull-down circuit, the second pull-down circuit and the third pull-down circuit by executing the plurality of second search loops in response to the calibration setting indicator having the fourth value.

12. A method for fabricating a memory device, comprising:
measuring a linearity of a first pull-up circuit, a second pull-up circuit, a third pull-up circuit, a first pull-down circuit, a second pull-down circuit and a third pull-down circuit to obtain a measurement result, each of the first pull-up circuit, the second pull-up circuit and the third pull-up circuit having a respective resistance value determined based on a respective pull-up code, and each of the first pull-down circuit, the second pull-down circuit and the third pull-down circuit having a respective resistance value determined based on a respective pull-down code;
determining a calibration method of a transmission driver based on the measurement result, the transmission driver including the first pull-up circuit, the second pull-up circuit, the third pull-up circuit, the first pull-down circuit, the second pull-down circuit and the third pull-down circuit;
determining the respective pull-up code of each of the first pull-up circuit, the second pull-up circuit and the third pull-up circuit based on the calibration method; and
determining the respective pull-down code of each of the first pull-down circuit, the second pull-down circuit and the third pull-down circuit based on the calibration method.

13. The method of claim 12, wherein
the transmission driver is included in a memory chip; and
the memory chip is on a wafer during the measuring the linearity.

14. The method of claim 13, wherein the determining the respective pull-up code and the determining the respective pull-down code are performed in a process of packaging the memory chip.

15. The method of claim 12, wherein
the measuring the linearity comprises measuring the linearity of the first pull-up circuit, the second pull-up circuit, the third pull-up circuit, the first pull-down circuit, the second pull-down circuit and the third pull-down circuit using an initial pull-up code and an initial pull-down code; and
the determining the respective pull-up code and the determining the respective pull-down code are performed using the initial pull-up code and the initial pull-down code.

16. The method of claim 12, wherein the measuring the linearity comprises:
measuring a plurality of resistance values of the first pull-up circuit, the second pull-up circuit, the third pull-up circuit, the first pull-down circuit, the second pull-down circuit and the third pull-down circuit while applying a plurality of voltage levels to the transmission driver.

17. A memory device comprising:
a transmission driver configured to output a multi-level signal; and
a memory storing a calibration setting indicator,
wherein the transmission driver comprises:
a first pull-up circuit, a second pull-up circuit and a third pull-up circuit, each of the first pull-up circuit, the second pull-up circuit and the third pull-up circuit having a respective resistance value determined based on a respective pull-up code, and
a first pull-down circuit, a second pull-down circuit and a third pull-down circuit, each of the first pull-down circuit, the second pull-down circuit and the third pull-down circuit having a respective resistance value determined based on a respective pull-down code,
wherein the calibration setting indicator indicates a method of setting the respective pull-up code and the respective pull-down code, and
wherein the calibration setting indicator is set based on measured linearity of the first, second and third pull-up circuits and the first, second and third pull-down circuits.

18. The memory device of claim 17, wherein the calibration setting indicator is configured to indicate a ZQ calibration method of the transmission driver.

19. The memory device of claim 17, wherein the calibration setting indicator is configured to store information as a test mode register set (TMRS).

20. The memory device of claim 19, wherein the calibration setting indicator comprises a fused fuse.

* * * * *